US012745396B2

(12) United States Patent
Kim et al.

(10) Patent No.: US 12,745,396 B2
(45) Date of Patent: Sep. 22, 2026

(54) VERTICAL SEMICONDUCTOR DEVICE WITH LOWER PATTERN COMPRISING SILICON AND GERMANIUM

(71) Applicant: Samsung Electronics Co., Ltd., Suwon-si (KR)

(72) Inventors: Sunggil Kim, Suwon-si (KR); Siyeong Yang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 473 days.

(21) Appl. No.: 18/166,854

(22) Filed: Feb. 9, 2023

(65) Prior Publication Data

US 2023/0328988 A1 Oct. 12, 2023

(30) Foreign Application Priority Data

Apr. 6, 2022 (KR) ........................ 10-2022-0042697

(51) Int. Cl.
*H10B 43/27* (2023.01)

(52) U.S. Cl.
CPC .................................... *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44;
(Continued)

(56) References Cited

U.S. PATENT DOCUMENTS

| | | | |
|---|---|---|---|
| 8,530,957 | B2 | 9/2013 | Mizushima et al. |
| 8,759,205 | B2 | 6/2014 | Aoyama et al. |

(Continued)

FOREIGN PATENT DOCUMENTS

| | | | |
|---|---|---|---|
| CN | 110148597 | A | 8/2019 |
| CN | 110265403 | A | 9/2019 |

(Continued)

OTHER PUBLICATIONS

Office Action in Korean Appln. No. 10-2022-0042697, mailed on Sep. 29, 2025, 9 pages (with English translation).

(Continued)

*Primary Examiner* — William B Partridge
*Assistant Examiner* — Gustavo G Ramallo
(74) *Attorney, Agent, or Firm* — Fish & Richardson P.C.

(57) ABSTRACT

A vertical semiconductor device may include a substrate, a pattern structure on the substrate, and a channel structure in a channel hole passing through the pattern structure. The pattern structure may include insulation patterns and gate structures alternately stacked in a vertical direction perpendicular to an upper surface of the substrate. The channel structure may extend in the vertical direction. The channel structure may include a data storage structure on an inner surface of the channel hole, a channel contacting the data storage structure, a lower pattern on the channel positioned at a lower portion of the channel hole, and a filling insulation pattern on the channel and the lower pattern. The channel may have a cylindrical shape. The lower pattern may include an oxide including silicon and germanium.

15 Claims, 28 Drawing Sheets

(58) Field of Classification Search

CPC .. H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | | |
|---|---|---|---|---|
| 8,828,853 | B2 | 9/2014 | Aoyama et al. | |
| 10,367,002 | B2 | 7/2019 | Chang et al. | |
| 10,424,505 | B2 | 9/2019 | Lee et al. | |
| 10,756,186 | B2 * | 8/2020 | Chen | H10B 41/27 |
| 10,923,344 | B2 | 2/2021 | Kohen et al. | |
| 11,062,904 | B2 | 7/2021 | Motoyama et al. | |
| 2005/0167716 | A1 * | 8/2005 | Kumura | H10B 53/00 257/296 |
| 2012/0052674 | A1 * | 3/2012 | Lee | H10D 30/694 257/E21.645 |
| 2016/0148947 | A1 * | 5/2016 | Seo | H10B 43/27 257/324 |
| 2016/0358933 | A1 * | 12/2016 | Rabkin | H10D 64/037 |
| 2017/0103998 | A1 * | 4/2017 | Chang | H10D 30/63 |
| 2019/0319100 | A1 * | 10/2019 | Chen | H10D 30/693 |
| 2019/0371661 | A1 | 12/2019 | Lee et al. | |
| 2020/0388626 | A1 | 12/2020 | Baraskar et al. | |
| 2021/0343714 | A1 | 11/2021 | Gardner et al. | |

FOREIGN PATENT DOCUMENTS

| | | | |
|---|---|---|---|
| KR | 2010/0011556 | A | 2/2010 |
| KR | 10-2017-0042127 | A | 4/2017 |
| KR | 2018/0032036 | A | 3/2018 |
| KR | 2020/0057639 | A | 5/2020 |

OTHER PUBLICATIONS

Notice of Allowance in Korean Appln. No. KR 10-2022-0042697, mailed on Jul. 1, 2026, 5 pages (with English translation).

* cited by examiner 4500
4210
4400
4100
4130
4003
5230
5210
5220
4200
4300
4003a
4003b
4003
4005
4001
4000
4002
4004
4006

222
210
220
130
126
124
122
128
120
104
100
A'
A
230
102
D2
D1
V 222
210
220
230
270
241
243
260a
264
262
244a
130
126
124
122
128
120
104
100
102
A'
A
D2
D1
V 280
222
210a
220a
130
126
124
122
128
120
104
100
A'
A
282
270
272
241
243
260a
264
262
244a
102
284
D2
D1
V 280
222
210a
220a
130
120
104
100
A'
A
282
290
270
272
241
243
260a
264
102
262
244a
284
D2
D1
V 280
222
210a
220a
130
120
104
100
A'
A
282
292
102
264
260a
243
241
272
244a
262
V
D1
D2

222
210
220
402
400
100
230
A'
A
D1
D2
V 222
210
220
210
220
210
220
210
220
210
220
210
220
210
210
220
210
402
400
100
A'
A
230
230
230
230
241a
410
D2
D1
V 222
210
220
210
220
210
220
210
220
210
220
210
220
210
210
220
210
402
400
100
A'
A
270
230
264
260a
243
241a
244a
410
262
V
D1
D2

280
222
210a
220a
402a
400a
100
A'
A
282
270
272
230
241a
243
260a
264
244a
410
262
D2
D1
V 280
222
210a
400a
100
A'
A
282
300a
272
241
243
260a
264
244a
410
262
D2
D1
V

VERTICAL SEMICONDUCTOR DEVICE WITH LOWER PATTERN COMPRISING SILICON AND GERMANIUM

CROSS-REFERENCE TO RELATED APPLICATION

This application claims priority under 35 USC § 119 to Korean Patent Application No. 10-2022-0042697, filed on Apr. 6, 2022 in the Korean Intellectual Property Office (KIPO), the contents of which are incorporated by reference herein in their entirety.

BACKGROUND

1. Field

Embodiments relate to a semiconductor device and/or a method for manufacturing the same. More particularly, embodiments relate to a vertical semiconductor device and/or a method for manufacturing the same.

2. Description of the Related Art

Recently, a vertical semiconductor device, in which memory cells are vertically stacked from surface of a substrate, has been developed. A vertical memory device may include gates stacked in a vertical direction and channel structures passing through the gates. A cell transistor constituting a memory cell may be formed on a side of a channel pattern included in the channel structure. A structure of the cell transistor having excellent operating characteristics and methods for forming the same may be required.

SUMMARY

Example embodiments provide a vertical semiconductor device having excellent operating characteristics.

Example embodiments provide methods for manufacturing a vertical semiconductor device having excellent operating characteristics.

According to an example embodiment, a vertical semiconductor device may include a substrate, a pattern structure on the substrate, and a channel structure in a channel hole passing through the pattern structure. The pattern structure may include insulation patterns and gate structures alternately stacked in a vertical direction perpendicular to an upper surface of the substrate. The channel structure may extend in the vertical direction. The channel structure may include a data storage structure on an inner surface of the channel hole, a channel contacting the data storage structure, a lower pattern on the channel positioned at a lower portion of the channel hole and a filling insulation pattern on the channel and the lower pattern. The channel may have a cylindrical shape. The lower pattern may include an oxide including silicon and germanium.

According to an example embodiment, a vertical semiconductor device may include a substrate, a pattern structure on the substrate, and a channel structure in a channel hole passing through the pattern structure. The pattern structure may include insulation patterns and gate structures alternately stacked in a vertical direction perpendicular to an upper surface of the substrate. The channel structure may extend in the vertical direction. The channel structure may include a data storage structure on a sidewall of the channel hole, a channel contacting the data storage structure, a lower pattern on the channel and positioned at a lower portion of the channel hole, a first mask pattern between the channel and the lower pattern, and a filling insulation pattern on the channel and the lower pattern. The channel may have a cylindrical shape, and the channel may include polysilicon containing germanium. The filling insulation pattern may include silicon oxide.

According to an example embodiment, a vertical semiconductor device may include a substrate, a lower circuit pattern on the substrate, a common source plate (CSP) on the lower circuit pattern, a pattern structure on the common source plate, a channel structure in a channel hole passing through the pattern structure, and a channel connection pattern contacting an upper surface of the common source plate. The pattern structure may include insulation patterns and gate structures alternately stacked in a vertical direction perpendicular to an upper surface of the substrate. The channel hole may extend to an upper portion of the common source plate in the vertical direction. The channel structure may include a data storage structure on an inner surface of the channel hole, a channel contacting the data storage structure, a lower pattern on the channel positioned at a lower portion of the channel hole, a first mask pattern between the channel and the lower pattern, and a filling insulation pattern on the channel and the lower pattern. The channel may have a cylindrical shape, and the channel may include polysilicon including germanium. The channel connection pattern may contact a lower outer wall of the channel in the channel structure.

According to an example embodiment, a method of manufacturing a vertical semiconductor device may include forming a mold structure on a substrate, the mold structure including insulation patterns and sacrificial patterns alternately and repeatedly stacked on the substrate in a vertical direction perpendicular to an upper surface of the substrate; forming a channel hole passing through the mold structure, the channel hole extending to an upper portion of the substrate; forming a data storage layer conformally on a sidewall of the channel hole and a bottom of the channel hole; forming an amorphous silicon layer conformally on the data storage layer; forming a first mask layer on the amorphous silicon layer, the first mask layer including pin holes exposing the amorphous silicon layer; forming a seed layer including germanium on the first mask layer and the amorphous silicon layer exposed by the pin holes; performing a first heat treatment on the seed layer to form crystal nucleation from the germanium in the amorphous silicon layer; and crystallizing the amorphous silicon layer from the crystal nucleation to form a channel including polysilicon containing germanium.

According to example embodiments, a method of manufacturing a vertical semiconductor device may include forming a mold structure on a substrate, the mold structure including insulation patterns and sacrificial patterns alternately and repeatedly stacked on the substrate in a vertical direction, the vertical direction perpendicular to an upper surface of the substrate; forming channel holes passing through the mold structure, each of the channel holes extending to an upper portion of the substrate; forming a data storage layer conformally on a sidewall of each of the channel holes and a bottom of each of the channel holes; forming an amorphous silicon layer conformally on the data storage layer; forming a first mask layer on the amorphous silicon layer, the first mask layer including pin holes exposing the amorphous silicon layer; forming a seed layer including germanium on the first mask layer and the amorphous silicon layer exposed by the pin holes; performing a first heat treatment on the seed layer to form crystal nucleation from the germanium in the amorphous silicon layer; forming a lower pattern at a lower portion of each of the channel holes by partially removing the seed layer, the partially removing the seed layer including removing a first part of the seed layer positioned on the first mask layer and partially removing a second part of the seed layer positioned at the lower portion of each of the channel holes such that a remaining portion of the seed layer is left in the lower portion of each of the channel holes after the partially removing the seed layer, the lower pattern exposing an exposed region of the first mask layer; crystallizing the amorphous silicon layer from the crystal nucleation to form a channel including polysilicon containing germanium; removing the exposed region of the first mask layer; forming a filling insulation pattern in each of the channel holes to fill the channel holes; and forming a pattern structure, in which the insulation patterns and gate structures are alternately and repeatedly stacked, by replacing the sacrificial patterns with the gate structures.

In the vertical semiconductor device according to example embodiments, the channel may be formed by performing a crystallization process from the crystal nucleation generated from the germanium in the amorphous silicon layer. Accordingly, the channel may be crystallized at a low temperature of 600° C. or less, so that the channel may have great (or, large) grain size and reduced grain boundary. Therefore, cell transistors and selection transistors formed on the channel may have improved mobility.

BRIEF DESCRIPTION OF THE DRAWINGS

Example embodiments will be more clearly understood from the following detailed description taken in conjunction with the accompanying drawings.

FIG. 1 is a block diagram illustrating an electronic system including a semiconductor device in accordance with example embodiments;

FIG. 2 is a schematic perspective view illustrating an electronic system including a semiconductor device in accordance with example embodiments;

FIGS. 3 to 19 are cross-sectional views illustrating a method for manufacturing a vertical semiconductor device in accordance with example embodiments;

FIG. 20 is an enlarged cross-sectional view of a vertical semiconductor device in accordance with example embodiments;

FIG. 21 is an enlarged cross-sectional view of a vertical semiconductor device in accordance with example embodiments;

FIGS. 22 to 27 are cross-sectional views illustrating a method of manufacturing a vertical semiconductor device in accordance with example embodiments; and FIG. 28 is an enlarged cross-sectional view of a vertical semiconductor device in accordance with example embodiments.

DETAILED DESCRIPTION

Figure 1:
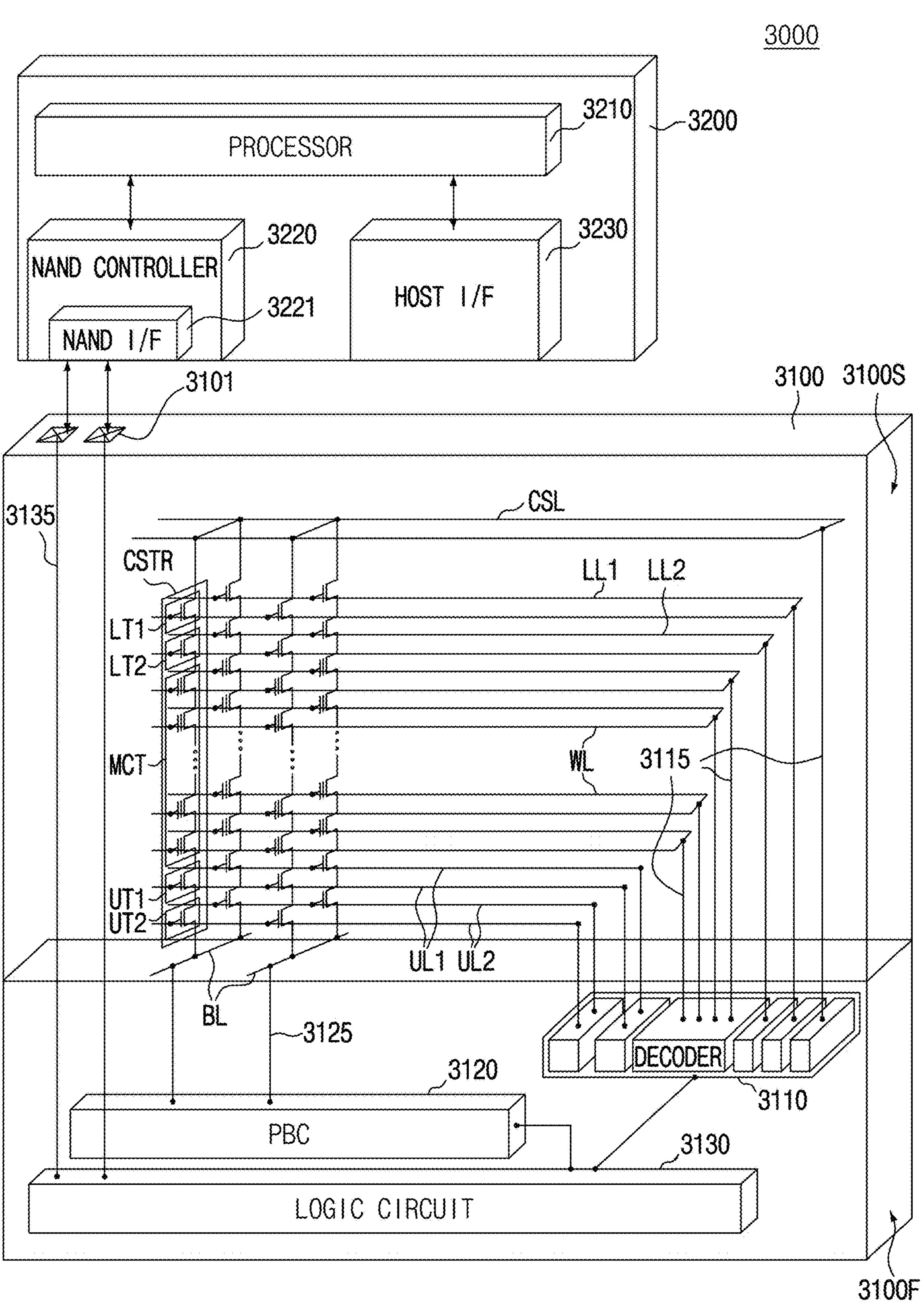
FIGS. 1 to 28 represent non-limiting, example embodiments as described herein.

FIG. 1 is a block diagram illustrating an electronic system including a semiconductor device in accordance with example embodiments.

Hereinafter, a direction parallel to a surface of a substrate is referred to as a first direction, and a direction parallel to the surface of the substrate and perpendicular to the first direction is referred to as a second direction. In addition, a direction perpendicular to the surface of the substrate is referred to as a vertical direction.

Referring to FIG. 1, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB) device, a computing system, a medical device, or a communication device including one or a plurality of semiconductor devices 3100.

The semiconductor device 3100 may be a vertical semiconductor device. For example, the semiconductor device 3100 may be a vertical semiconductor device described with reference to FIGS. 19 to 21 or FIGS. 27 and 28.

The vertical semiconductor device may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may include bit lines BL, a common source line CSL, word lines WL, first and second gate upper lines UL1 and UL2, first and second gate lower lines LL1 and LL2, and memory cell strings CSTR between the bit line BL and the common source line CSL. In example embodiments, the first structure 3100F may be formed on a substrate, and the second structure 3100S may be formed on the first structure 3100F. In the second structure 3100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified in accordance with example embodiments.

In example embodiments, the upper transistors UT1 and UT2 may include string select transistors, and the lower transistors LT1 and LT2 may include ground select transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 that may be connected with each other in serial. The upper transistors UT1 and UT2 may include a string select transistor UT1 and an upper erase control transistor UT2 that may be connected with each other in serial. At least one of the lower erase control transistor LT1 and the upper erase control transistor UT1 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through a first connection wiring 3115 extending from the first structure 3100F to the second structure 3100S. The bit lines BL may be electrically connected to the page buffer circuit 3120 through a second connection wiring 3125 extending from the first structure 3100F to the second structure 3100S.

The first and second lower gate lines LL1 and LL2, the word lines WL, and the first and second upper gate lines UL1 and UL2 may serve as gate electrodes, respectively. Each of the gate electrodes may include a metal pattern.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130.

The semiconductor device 3100 may communicate with the controller 3200 through an input/output pad 3101 electrically connected to the logic circuit 3130. The input/output pad 3101 may be electrically connected to the logic circuit 3130 through an input/output connection line 3135 extending from the first structure 3100F to the second structure 3100S.

The controller 3200 may include a processor 3210, a NAND controller 3220 and a host interface 3230. In example embodiments, the electronic system 3000 may include a plurality of semiconductor devices 3100. In this case, the controller 3200 may control the plurality of semiconductor devices 3100.

The processor 3210 may control overall operation of the electronic system 3000 including the controller 3200. The processor 3210 may operate according to a desired and/or alternatively predetermined firmware, and may access the semiconductor device 3100 by controlling the NAND controller 3220. The NAND controller 3220 may include a NAND interface 3221 for communicating with the semiconductor device 3100. A control command for controlling the semiconductor device 3100, data to be written in the memory cell transistors MCT of the semiconductor device 3100, and data to be read from the memory cell transistors MCT of the semiconductor device 3100 may be transferred by the NAND interface 3221. The host interface 3230 may be used to communicate between the electronic system 3000 and an external host. When a control command is received from the external host through the host interface 3230, the processor 3210 may control the semiconductor device 3100 in response to the control command.

Figure 2:
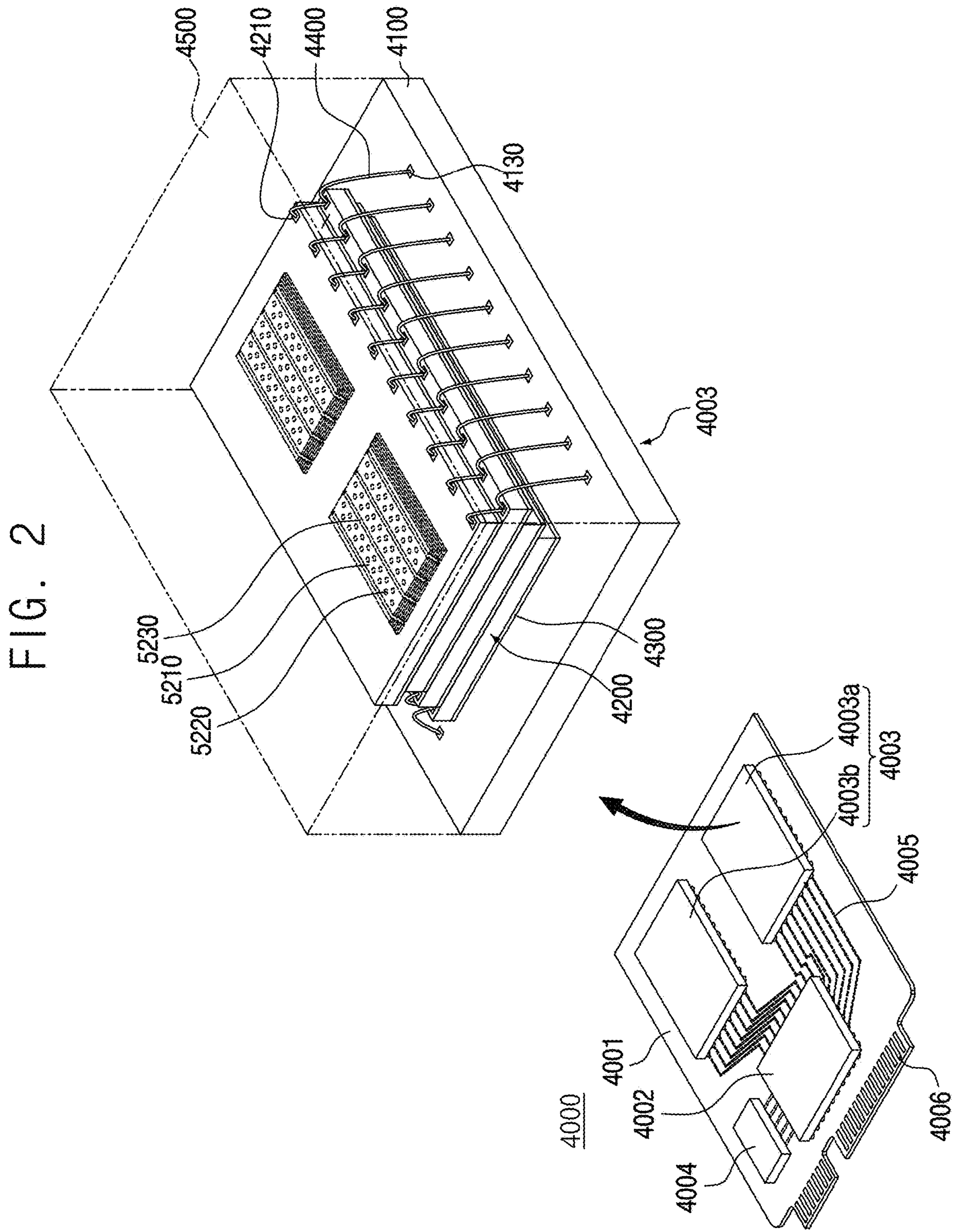

FIG. 2 is a schematic perspective view illustrating an electronic system including a semiconductor device in accordance with example embodiments.

Referring to FIG. 2, the electronic system 4000 may include a main board 4001, a controller 4002 mounted on the main board 4001, one or more semiconductor packages 4003, and a dynamic random access memory (DRAM) device 4004. The semiconductor package 4003 and the DRAM device 4004 may be connected to the controller 4002 by wiring patterns 4005 formed on the main board 4001.

The main board 4001 may include a connector 4006 including a plurality of pins coupled to an external host. The number and arrangement of the plurality of pins in the connector 4006 may be changed depending on a communication interface between the electronic system 4000 and the external host. In example embodiments, the electronic system 4000 may be communicated (e.g., connected) with the external host according to one of interfaces such as USB, Peripheral Component Interconnect Express (PCI-Express), Serial Advanced Technology Attachment (SATA), or M-Phy for Universal Flash Storage (UFS). In example embodiments, the electronic system 4000 may be operated by power supplied from an external host through the connector 4006. The electronic system 4000 may further include a power management integrated circuit (PMIC) that distributes power supplied from the external host to the controller 4002 and the semiconductor package 4003.

The controller 4002 may write data in the semiconductor package 4003 or read data from the semiconductor package 4003, and may enhance an operating speed of the electronic system 4000. The DRAM device 4004 may be a buffer memory for reducing a speed difference between the semiconductor package 4003 for storing data and an external host. The DRAM device 4004 included in the electronic system 4000 may serve as a cache memory, and may provide a space for temporarily storing data in a control operation of the semiconductor package 4003. When the electronic system 4000 includes the DRAM device 4004, the controller 4002 may further include a DRAM controller for controlling the DRAM device 4004 in addition to the NAND controller for controlling the semiconductor package 4003.

The semiconductor package 4003 may include first and second semiconductor packages 4003*a* and 4003*b* spaced apart from each other. Each of the first and second semiconductor packages 4003*a* and 4003*b* may be a semiconductor package including a plurality of semiconductor chips 4200. Each of the first and second semiconductor packages 4003*a* and 4003*b* may include a package substrate 4100, the semiconductor chips 4200 on the package substrate 4100, and adhesive layers 4300 disposed on lower surfaces of the semiconductor chips 4200, a connection structure 4400 for electrically connecting the semiconductor chips 4200 and the package substrate 4100, and a mold layer 4500 covering the semiconductor chips 4200 and the connection structure 4400 on the package substrate 4100.

The package substrate 4100 may be a printed circuit board (PCB) including package upper pads 4130. Each of the semiconductor chips 4200 may include an input/output pad 4210. Each of the semiconductor chips 4200 may include gate electrode structures 5210, memory channel structures 5220 passing through the gate electrode structures 5210, and separation structures 5230 separating the gate electrode structures 5210. Each of the semiconductor chips 4200 may include, e.g., a vertical semiconductor device described with reference to FIGS. 19 to 21 or FIGS. 27 and 28.

In example embodiments, the connection structure 4400 may be a bonding wire for electrically connecting the input/output pad 4210 and the package upper pads 4130.

A non-volatile memory device or a storage device in accordance with example embodiments may be mounted using various package types or package configurations.

Hereinafter, a vertical semiconductor device in accordance with example embodiments and/or a method for manufacturing the same may be described in more detail. Particularly, a vertical semiconductor device including a channel having a great grain size and a method for manufacturing the same may be described in more detail.

FIGS. 3 to 19 are cross-sectional views illustrating a method for manufacturing a vertical semiconductor device in accordance with example embodiments.

FIGS. 6 to 13 are enlarged cross-sectional views illustrating a portion of channel holes.

Figure 3:
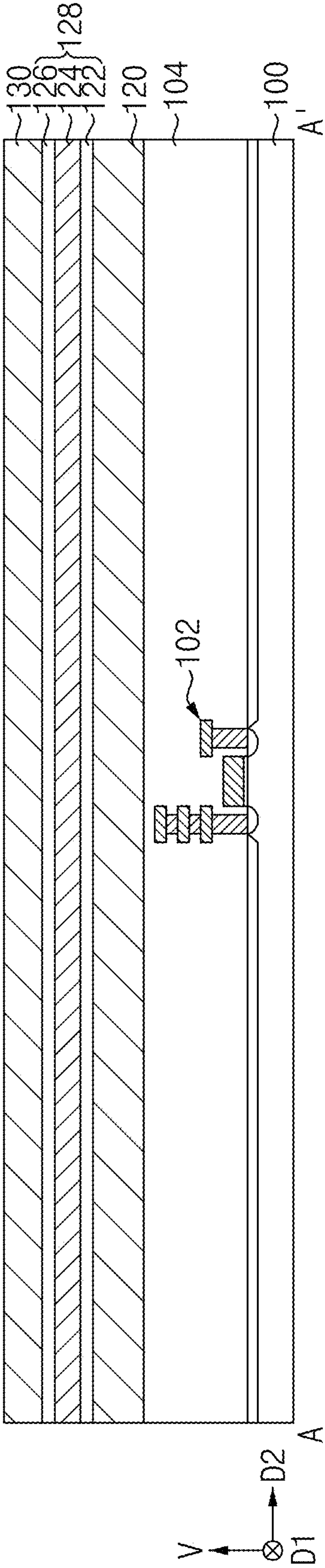

Referring to FIG. 3, a lower circuit pattern 102 may be formed on a substrate 100, and a lower insulating interlayer 104 may be formed to cover the lower circuit pattern 102. The lower circuit pattern 102 may include, e.g., a transistor and a wiring. The lower circuit pattern 102 may constitute peripheral circuits in the vertical semiconductor device.

A common source plate (CSP) 120 may be formed on the lower insulating interlayer 104. A first lower sacrificial layer structure 128 may be formed on the common source plate 120. A first support layer 130 may be formed on the first lower sacrificial layer structure 128. Therefore, the vertical semiconductor device having a COP (Cell Over Periphery) structure may be manufactured by subsequent processes.

In example embodiments, the common source plate 120 may include, e.g., polysilicon doped with n-type impurities. In some example embodiments, the common source plate 120 may include a metal silicide layer and a polysilicon layer doped with n-type impurities sequentially stacked. The metal silicide layer may include, e.g., tungsten silicide.

The first lower sacrificial layer structure 128 may include first to third lower sacrificial layers 122, 124 and 126 sequentially stacked. Each of the first and third lower sacrificial layers 122 and 126 may include, e.g., an oxide such as silicon oxide, and the second lower sacrificial layer 124 may include, e.g., a nitride such as silicon nitride.

The first support layer 130 may include a material having an etch selectivity with respect to the first to third lower sacrificial layers 122, 124 and 126. The first support layer 130 may include, e.g., polysilicon doped with n-type impurities.

In some example embodiments, processes for forming the lower circuit pattern, the lower insulating interlayer, and the common source plate on the substrate 100 may not be performed. In this case, the first lower sacrificial layer structure 128 and the first support layer 130 may be formed on the upper surface of the substrate 100.

Figure 4:
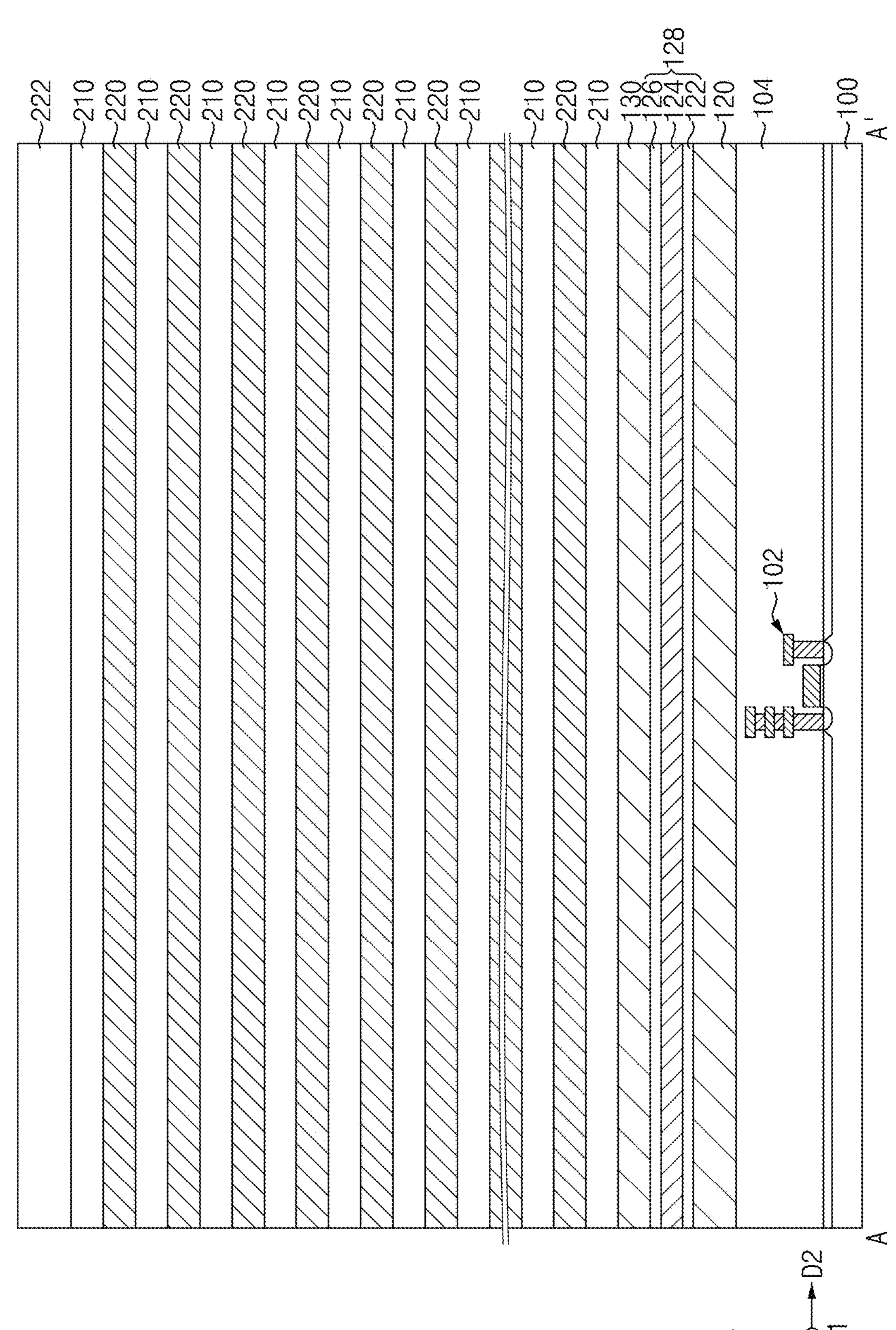

Referring to FIG. 4, a first insulation layer 210 and a first sacrificial layer 220 may be alternately and repeatedly stacked on the first support layer 130 in the vertical direction V to form a mold layer including first insulation layers 210 and first sacrificial layers 220. An upper insulation layer 222 may be formed on an uppermost first insulation layer 210.

The first insulation layer 210 may include an oxide such as silicon oxide, and the first sacrificial layer 220 may include a material having an etch selectivity with respect to the first insulation layer 210. The first sacrificial layer 220 may include a nitride such as silicon nitride.

Figure 5:
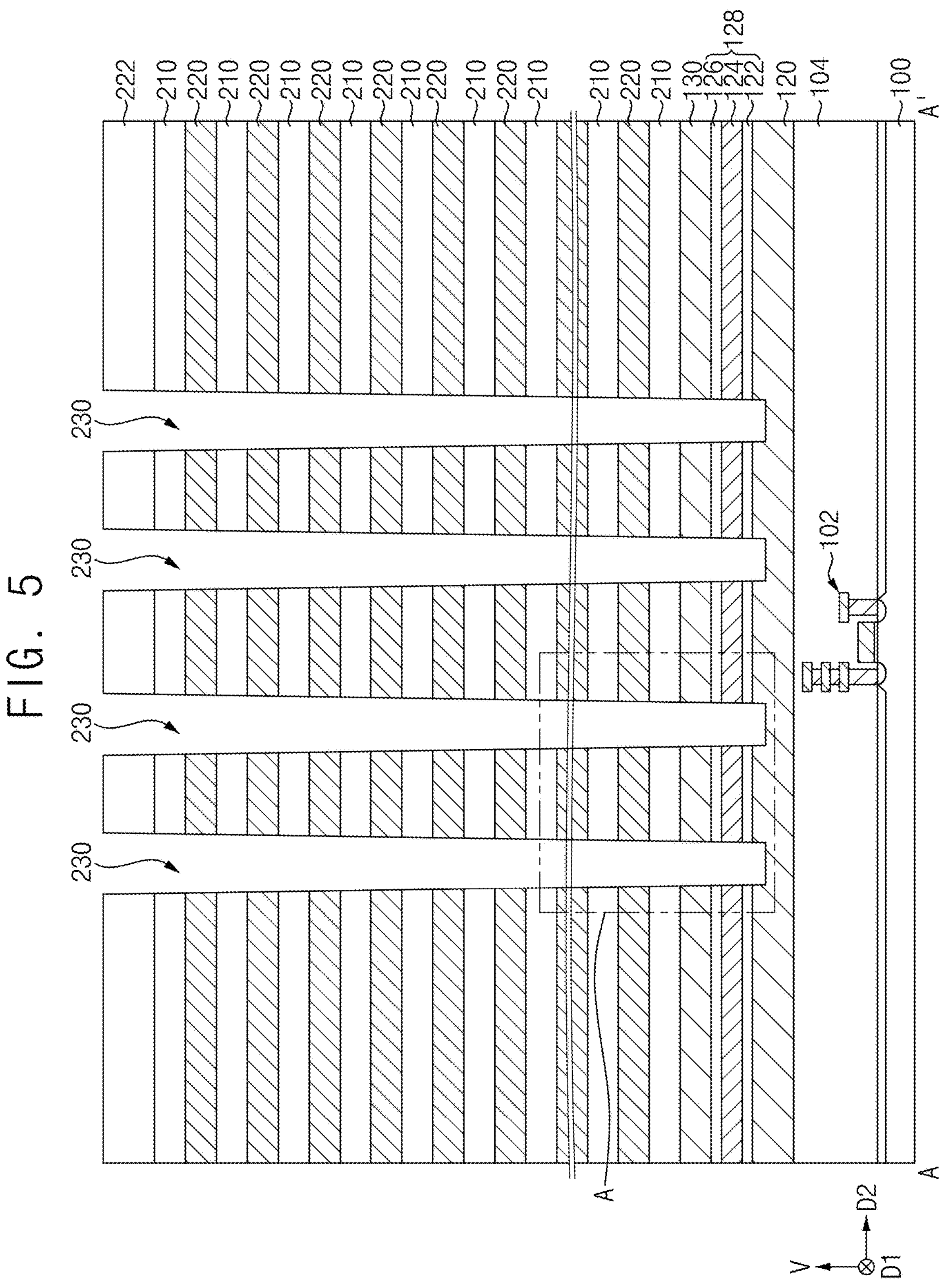

Referring to FIG. 5, an etch mask pattern (not shown) may be formed on the upper insulation layer 222. The upper insulation layer 222, the first insulation layers 210, the first sacrificial layers, the first support layer 130, and the first lower sacrificial layer structure 128 may be etched using the etch mask pattern to form channel holes 230 exposing an upper portion of the common source plate 120. In the etching process, the upper portion of the common source plate 120 may also be partially etched.

The channel holes 230 may be regularly arranged in units of cell blocks. In one cell block, a plurality of channel holes 230 may be arranged in each of the first and second directions D1 and D2.

In some embodiments, a sidewall of the channel hole 230 may have a vertical slope with respect to an upper surface of the common source plate 120. However, in some embodiments, when the channel hole 230 is formed by an actual etching process, the sidewall of the channel hole 230 may have an inclination such that an inner width gradually decreases toward the substrate 100. Accordingly, a lower width of the channel hole 230 may be less than an upper width of the channel hole 230.

Hereinafter, FIGS. 6 to 13, which are enlarged views of a portion A of FIG. 5, are described. Each of the enlarged views may include a portion of the channel holes.

Figure 6:
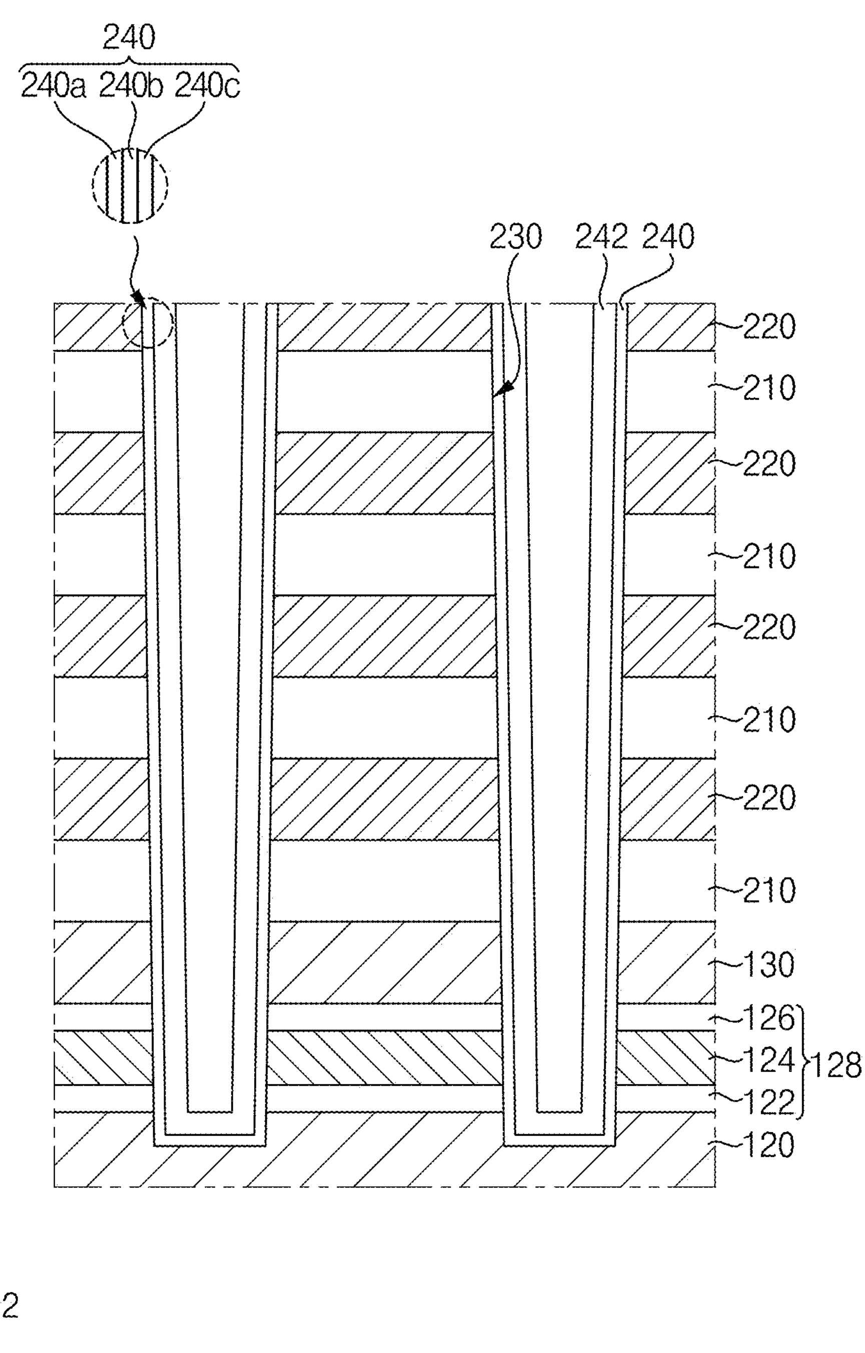

Referring to FIG. 6, a first blocking dielectric layer 240*a*, a charge storage layer 240*b*, and a tunnel insulation layer 240*c* may be sequentially and conformally formed on the sidewall and a bottom of the channel hole 230 and a surface of the upper insulation layer 222. In order to avoid the complexity of the drawings, the first blocking dielectric layer 240*a*, the charge storage layer 240*b*, and the tunnel insulation layer 240*c* may be merged and illustrated as a single layer, which is referred to as a data storage layer 240.

In example embodiments, the first blocking dielectric layer 240*a* may include silicon oxide, the charge storage layer 240*b* may include silicon nitride, and the tunnel insulation layer 240*c* may include silicon oxide. The first blocking dielectric layer 240*a*, the charge storage layer 240*b*, and the tunnel insulation layer 240*c* may be formed by a chemical vapor deposition (CVD) process or an atomic layer deposition (ALD) process.

An amorphous silicon layer 242 may be conformally formed on the data storage layer 240 (e.g., the tunnel insulation layer). The amorphous silicon layer 242 may be formed along a profile of the data storage layer 240, so that the amorphous silicon layer 242 may not fill an inner space of the channel hole 230. The amorphous silicon layer 242 may be formed by an atomic layer deposition process. The amorphous silicon layer 242 may be a starting material layer for forming a channel layer of a memory cell transistor and a selection transistor.

In example embodiments, the amorphous silicon layer 242 may have a thickness of 100 nm to 200 nm, but may not be limited thereto.

Figure 7:
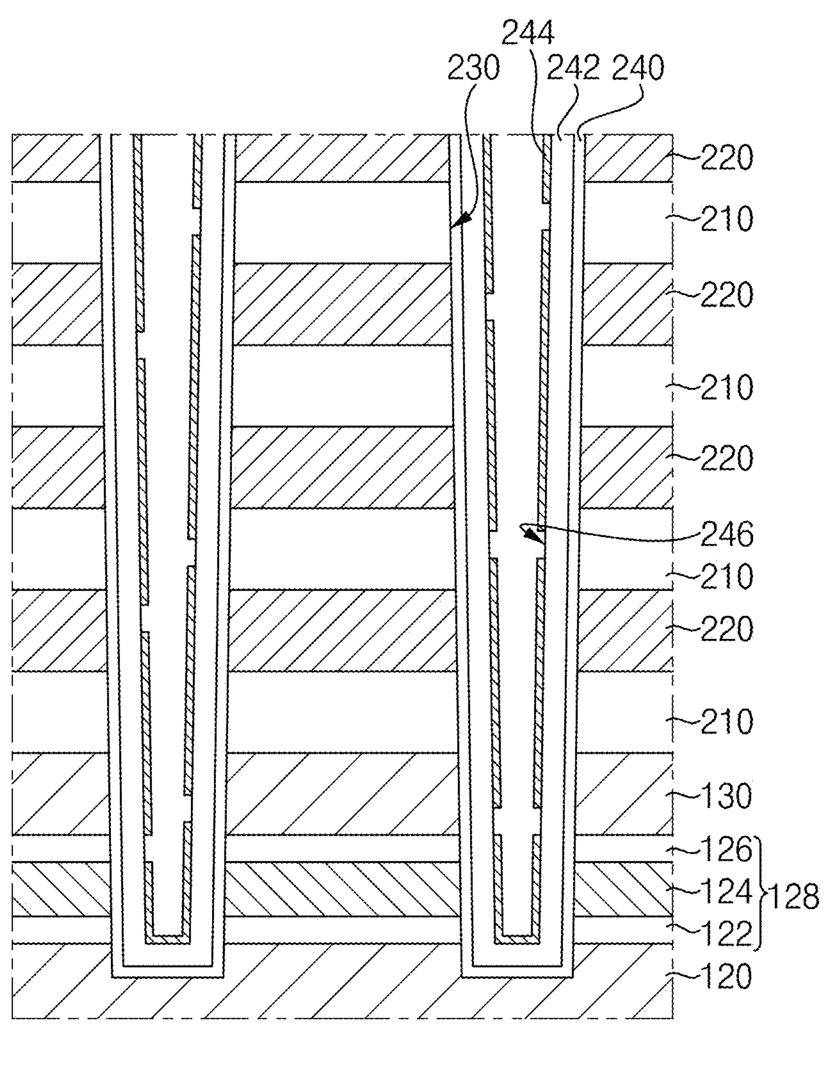
Figure 7:
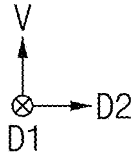

Referring to FIG. 7, a first mask layer 244 including pin holes 246 may be formed on the amorphous silicon layer 242. Each of the pin holes 246 may pass through the first mask layer 244, and thus the surface of the amorphous silicon layer 242 may be exposed by the pin holes 246.

The first mask layer 244 may include a material capable of forming a layer including the pin holes 246 according to a surface roughness of the layer. When the material is deposited to have a thin thickness, the material may have the pin holes 246. In example embodiments, the first mask layer 244 may include the material capable of forming the layer including the pin holes 246, when the material is deposited to have a thickness of about 5 nm or less. The first mask layer 244 may include, e.g., silicon nitride, silicon oxide, titanium nitride, aluminum oxide, or the like.

In example embodiments, the first mask layer 244 may be formed to a thickness of about 1 nm to about 5 nm. When the thickness of the first mask layer 244 is greater than about 5 nm, the first mask layer 244 may have a good roughness, and thus the first mask layer 244 may not include pin holes 246. When the thickness of the first mask layer 244 is less than about 1 nm, forming of the first mask layer 244 may not easy. For example, the first mask layer 244 may be formed to have the thickness of about 1 nm to about 1.5 nm.

The process for forming the first mask layer 244 may include depositing process of a mask material layer and wet cleaning process of a surface of the mask material layer.

During depositing process of the mask material layer, a crystal nucleation and crystallization may not occur in the amorphous silicon layer 242. The crystal nucleation and crystallization of the amorphous silicon layer 242 may be performed at a temperature higher than about 600° C. Therefore, the process for forming the mask material layer may be performed at a temperature lower than 600° C. As such, the mask material layer may be formed at the temperature lower than 600° C. to have the thickness of about 5 nm or less. The mask material layer may be formed by an atomic layer deposition process.

In the wet cleaning process of the mask material layer, sizes of the pin holes 246 on a surface of the mask material layer may increase or the pin holes 246 may be additionally formed on portions of the mask material layer having relatively thin thickness.

A position of each of the pin holes 246 may be a position where the crystal nucleation for a crystal growth is formed in subsequent processes. Accordingly, the positions of the crystal nucleation (e.g., positions of crystallite) may be adjusted by an arrangement of the pin holes 246. As a distance between the positions of crystal nucleation increases, a grain size may increase after the crystal growth. In some embodiments, a distance between adjacent pin holes 246 may be increased to increase the grain size. In some embodiments, the pin holes 246 in the first mask layer 244 may have a low density.

In example embodiments, the density of the pin holes 246 in the first mask layer 244 may be controlled by a deposition thickness of the mask material layer and conditions of the wet cleaning process of the mask material layer. In example embodiments, a distance between adjacent pin holes 246 in the first mask layer 244 may be equal to or greater than a target grain size.

Figure 8:
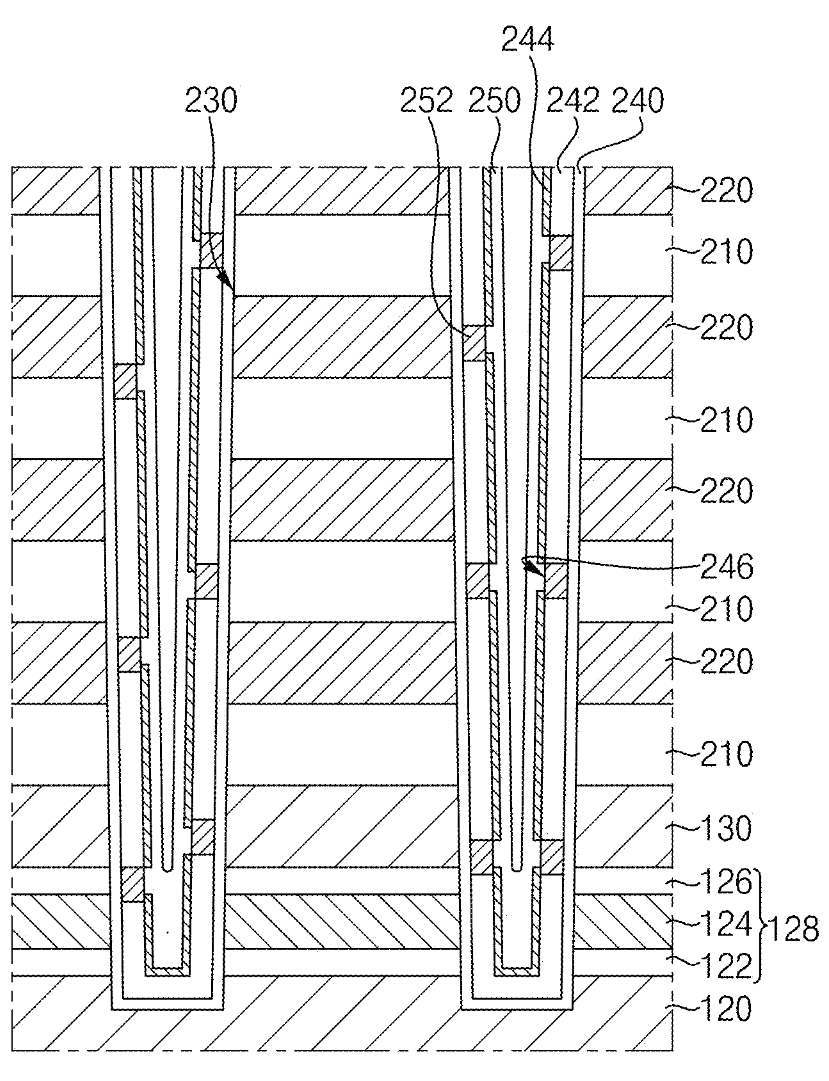
Figure 8:
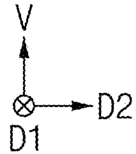

Referring to FIG. 8, a seed layer 250 may be formed on the first mask layer 244 and the amorphous silicon layer 242 exposed by the pin holes 246. The seed layer 250 may serve as a seed for forming the crystal nucleation in the amorphous silicon layer 242. The seed layer 250 may include a material different from the amorphous silicon. The seed layer 250 may directly contact the amorphous silicon layer 242 selectively at the position of the pin hole 246 in the first mask layer 244.

The seed layer 250 may be formed to have a thickness so as not to completely fill the inner space of the channel hole 230. The thickness of the seed layer 250 may be greater than the thickness of the first mask layer 244.

An inner width of the channel hole 230 may be very small. Particularly, the lower width of the channel hole 230 may be less than the upper width of the channel hole 230. Therefore, sidewalls of the seed layer 250 may contact at a lower portion of the channel hole 230, and thus the sidewalls of the seed layer 250 may be folded. Accordingly, a vertical thickness of the seed layer 250 positioned at the lower portion of the channel hole 230 may be greater than the thickness of the seed layer 250 on the sidewall of the channel hole 230. The seed layer 250 may fill the lower portion of the channel hole 230.

An upper surface of the seed layer 250 positioned at the lower portion of the channel hole 230 may be lower than a position where gate structures that actually operate are formed. In example embodiments, the upper surface of the seed layer 250 positioned at the lower portion of the channel hole 230 may be lower than a lower surface of a lowermost first sacrificial pattern **220*a***.

The process for forming the seed layer 250 may be performed at a temperature lower than a temperature for generating the crystal nucleation in the amorphous silicon layer 242 and a temperature for crystallization of the amorphous silicon layer. The amorphous silicon layer may be nucleated and crystallized at a temperature of about 600° C. or higher. Therefore, the process for forming the seed layer 250 may be performed at a temperature lower than 600° C. The seed layer 250 may be formed by an atomic layer deposition process.

The seed layer 250 may include a material capable of generating the crystal nucleation at a temperature lower than 600° C., which is the temperature for generating the crystal nucleation in the amorphous silicon layer 242. The seed layer 250 may include germanium. Hereinafter, it is described that the seed layer 250 is a germanium layer.

After forming the germanium layer 250, a first heat treatment process may be performed to crystallize the germanium layer 250. The first heat treatment process may include, e.g., a rapid thermal process (RTP), a furnace, annealing, and/or a laser. In example embodiments, nitrogen or oxygen may be introduced during the first heat treatment process.

When the first heat treatment process is performed, the germanium included in germanium layer 250 may be diffused into the amorphous silicon layer 242 through portions (e.g., the pin hole regions) contacting the amorphous silicon layer 242 and the germanium layer 250. Therefore, the crystal nucleation 252 may be generated in the amorphous silicon layer 242 by the germanium. That is, the first heat treatment process may be a process for generating the crystal nucleation 252 in the amorphous silicon layer 242 using a material different from the amorphous silicon layer 242. Since the crystal nucleation 252 are generated only through the pin holes 246 of the first mask layer 244, positions of the crystal nucleation 252 may be spaced apart from each other in the amorphous silicon layer 242.

The first heat treatment process may be performed at the temperature lower than 600° C., e.g., higher than about 500° C. and lower than about 600° C. Accordingly, the crystal nucleation may not be generated by the amorphous silicon layer 242, in the first heat treatment process.

The crystal nucleation 252 serving as crystallite may be generated only at the pin hole regions. As the pin hole regions are controlled, positions of the crystal nucleation 252 may be controlled. Accordingly, a distance between the positions of crystal nucleation 252 may be controlled to be at least equal to or greater than the target grain size.

Figure 9:
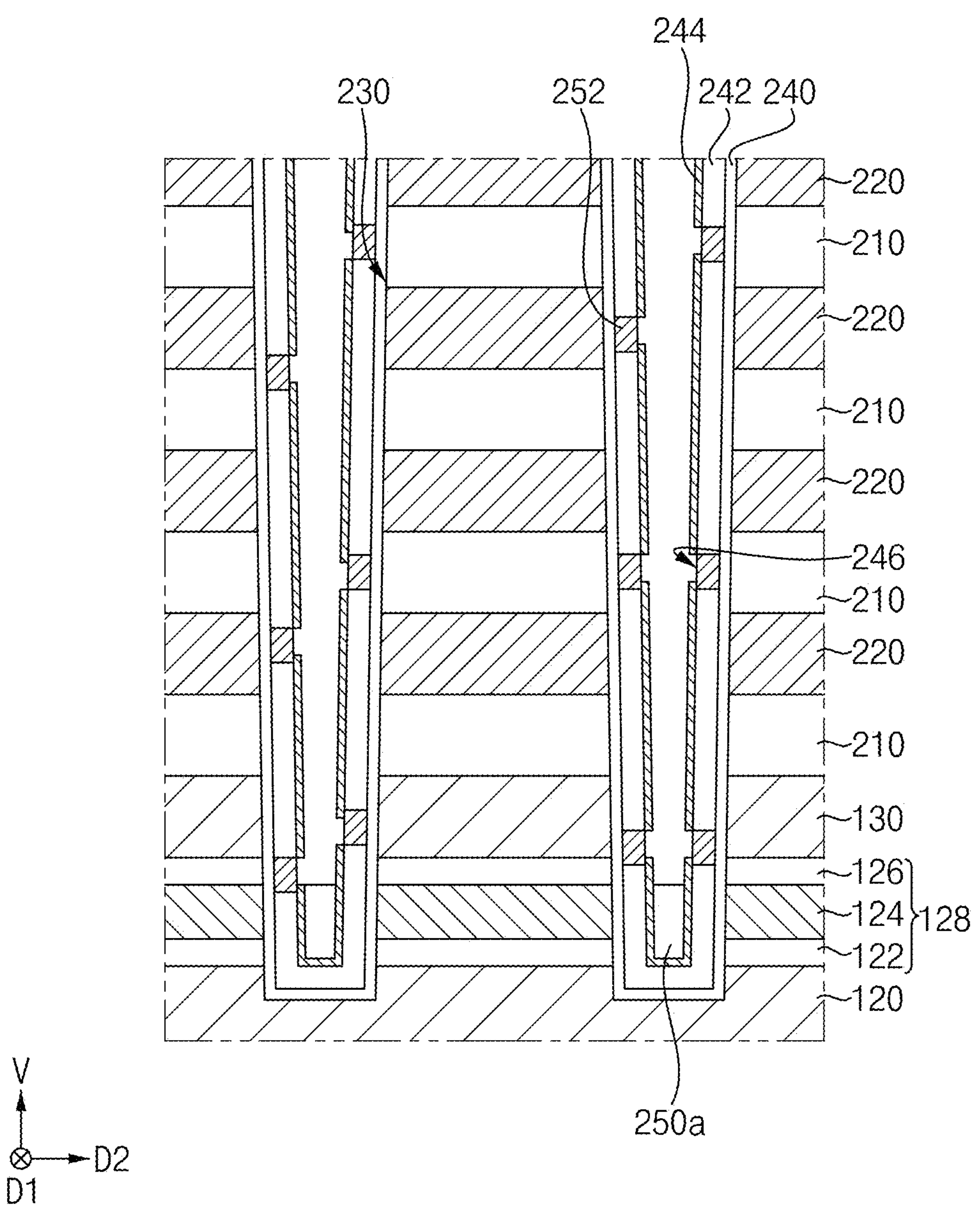

Referring to FIG. 9, the germanium layer 250 may be partially removed.

At this time, the crystal nucleation 252 formed in the amorphous silicon layer 242 may not be removed. Further, the germanium layer 250 positioned at the lower portion of the channel hole 230 may have relatively thick thickness, so that the germanium layer 250 may remain to have a partial thickness, after the removing process. Accordingly, a germanium pattern **250*a* may be formed at the lower portion of the channel hole 230**.

Figure 10:
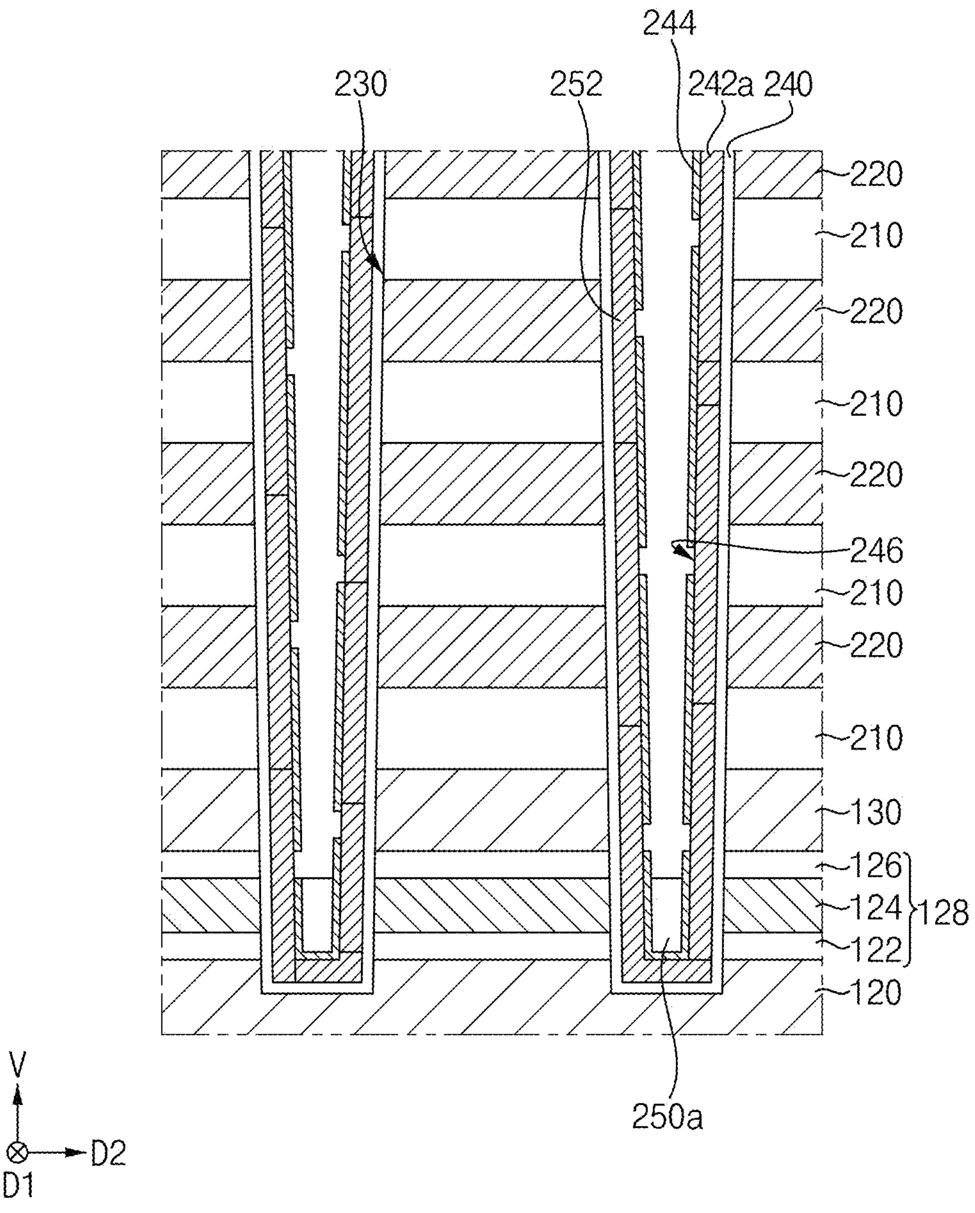

Referring to FIG. 10, a second heat treatment process may be performed to crystallize the amorphous silicon layer 242. When the second heat treatment process is performed, a lateral solid phase epitaxial (SPE) growth may be performed laterally from the portions of the crystal nucleation 252. That is, the second heat treatment process may be a lateral solid-state epitaxy process.

The amorphous silicon layer 242 may be crystallized to form a polysilicon layer **242*a*. By performing the above process, a germanium element may be included in the polysilicon layer 242*a***.

Since the crystal nucleation 252 (refer to FIG. 9) for crystallization are already formed in the amorphous silicon layer 242, a crystallization of the amorphous silicon layer 242 from the crystal nucleation 252 may be performed at a temperature of 600° C. or less. Therefore, the second heat treatment process may be performed at a temperature lower than 600° C., e.g., higher than 500° C. and lower than 600° C.

In the crystallization process, a grain growth may be performed laterally from the crystal nucleation 252 in the amorphous silicon layer 242. The grain growth may be performed in the amorphous silicon layer 242 in the vertical direction. The grains may be grown as much as the distance between adjacent positions of crystal nucleation 252, so that the grain size may be controlled by the distance between the adjacent positions of crystal nucleation 252. As the distance between the adjacent positions of crystal nucleation 252 is increased, the polysilicon layer 242*a* may have a great grain size. As the grain size is increased, a grain boundary may decrease.

The polysilicon layer 242*a* may be formed as channel layers of cell transistors and selection transistors by subsequent processes. Thus, as the grain size of the polysilicon layer 242*a* increases, a mobility of each of the cell transistors and selection transistors may be improved. Therefore, the electrical characteristics of the cell transistor and the selection transistor may be improved.

On the other hand, when the crystallization process is performed by the heat treatment at a temperature of 600° C. or higher after forming the amorphous silicon layer 242, the generation of the crystal nucleation and the grain growth may simultaneously occur in the amorphous silicon layer 242. Therefore, the grain size may not be controlled, and thus grains having large size may not be created.

As described above, the process for generating the crystal nucleation 252 in the amorphous silicon layer 242 and the crystallization process of the amorphous silicon layer 242 may be separately performed from each other. The grain size of the polysilicon layer 242*a* formed by the above-described process may be greater than a grain size of the polysilicon layer 242*a* formed by crystallization by the heat treatment at a temperature of 600° C. or higher after forming the amorphous silicon layer.

Figure 11:
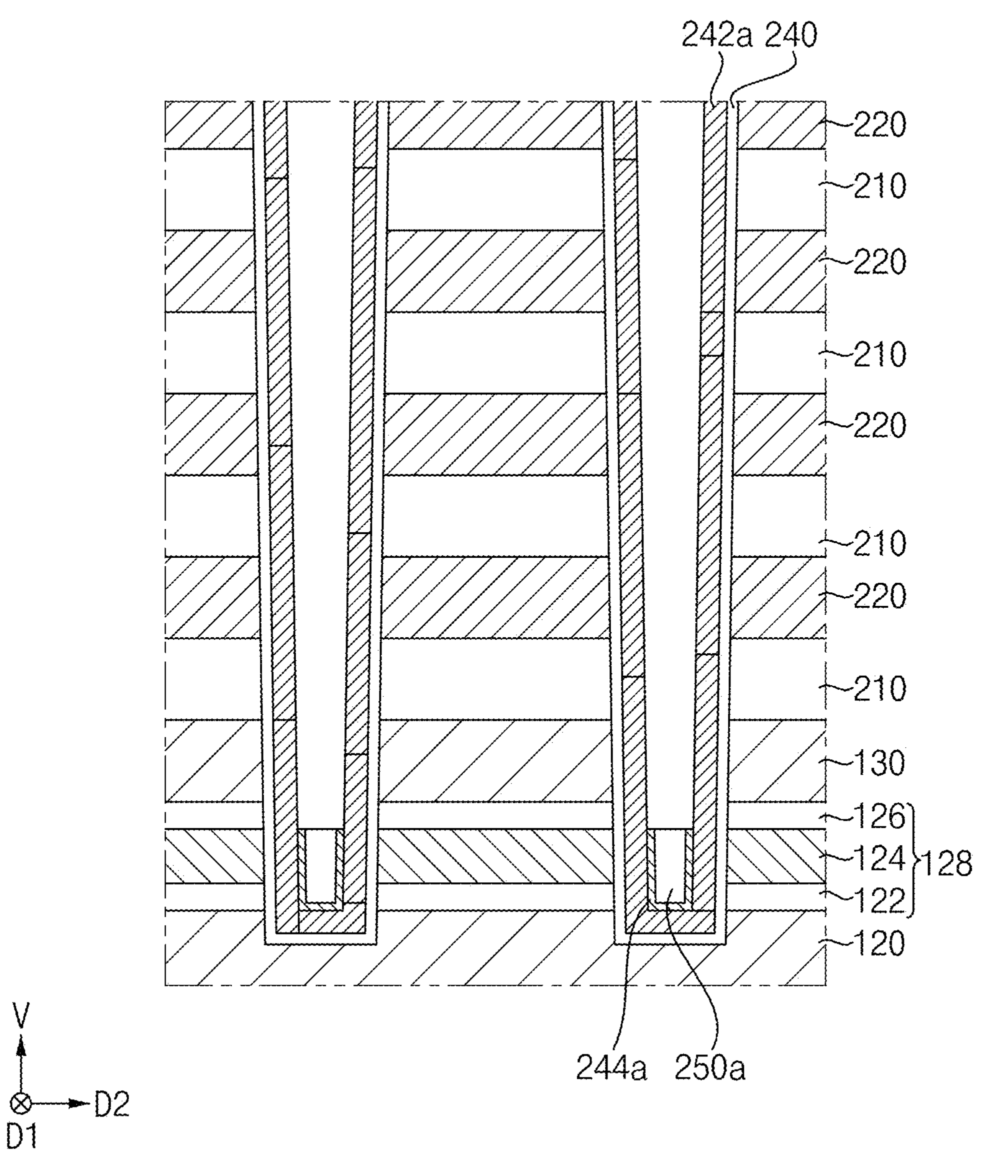

Referring to FIG. 11, the first mask layer 244 may be removed.

In the removing process, a portion of the first mask layer 244 contacting the surface of the germanium pattern 250*a* may remain to form a first mask pattern 244*a*. The first mask pattern 244*a* may be formed at the lower portion of the channel hole 230. The first mask pattern 244*a* may surround a sidewall and a bottom of the germanium pattern 250*a*.

In some example embodiments, the removing of the first mask layer 244 may be performed before the second heat treatment process for the crystallization of the amorphous silicon layer 242.

In some example embodiments, the removing of the first mask layer 244 may be omitted. In this case, the first mask layer 244 may be an insulation material. In this case, the first mask layer 244 may remain on the polysilicon layer 242*a*.

Figure 12:
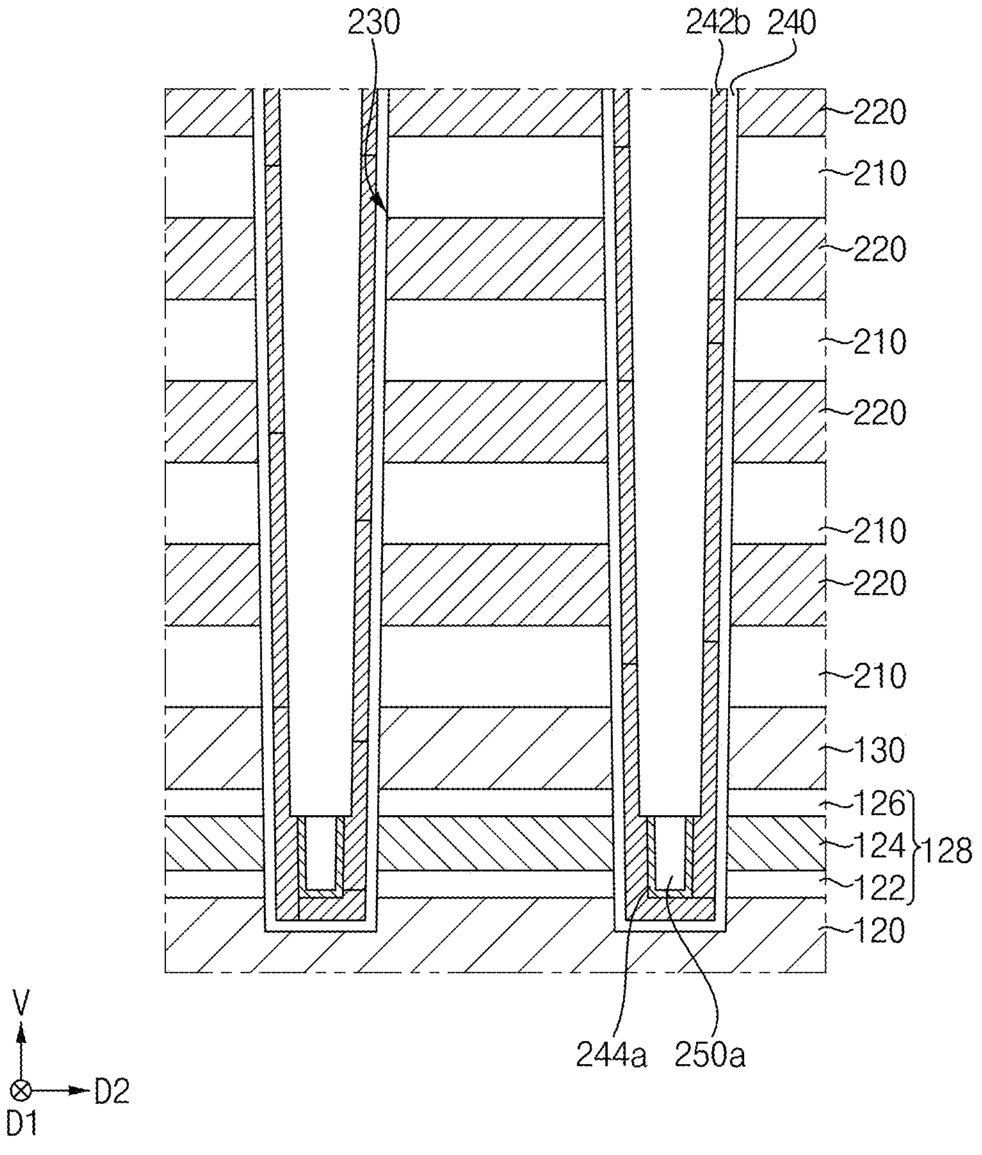

Referring to FIG. 12, the surface of the polysilicon layer 242*a* may be removed by a partial thickness, in order to reduce the thickness of the polysilicon layer 242*a*.

A channel layer 242*b* having a target thickness may be formed by partially removing the surface of the polysilicon layer 242*a*. In this case, the polysilicon layer 242*a* positioned below the upper surfaces of the germanium pattern 250*a* and the first mask pattern 244*a* may not be removed. The channel layer 242*b* may have a first portion positioned higher than the upper surfaces of the germanium pattern 250*a* and the first mask pattern 244*a* and a second portion positioned lower than the upper surfaces of the germanium pattern 250*a* and the first mask pattern 244*a*. In the channel layer 242*b*, the thickness of the first portion may be less than the thickness of the second portion.

However, in some example embodiments, the partially removing of the surface of the polysilicon layer 242*a* may be omitted. In this case, the polysilicon layer 242*a* may serve as a channel layer. In addition, a channel formed by subsequent processes may have a uniform thickness depending on a position thereof.

Figure 13:
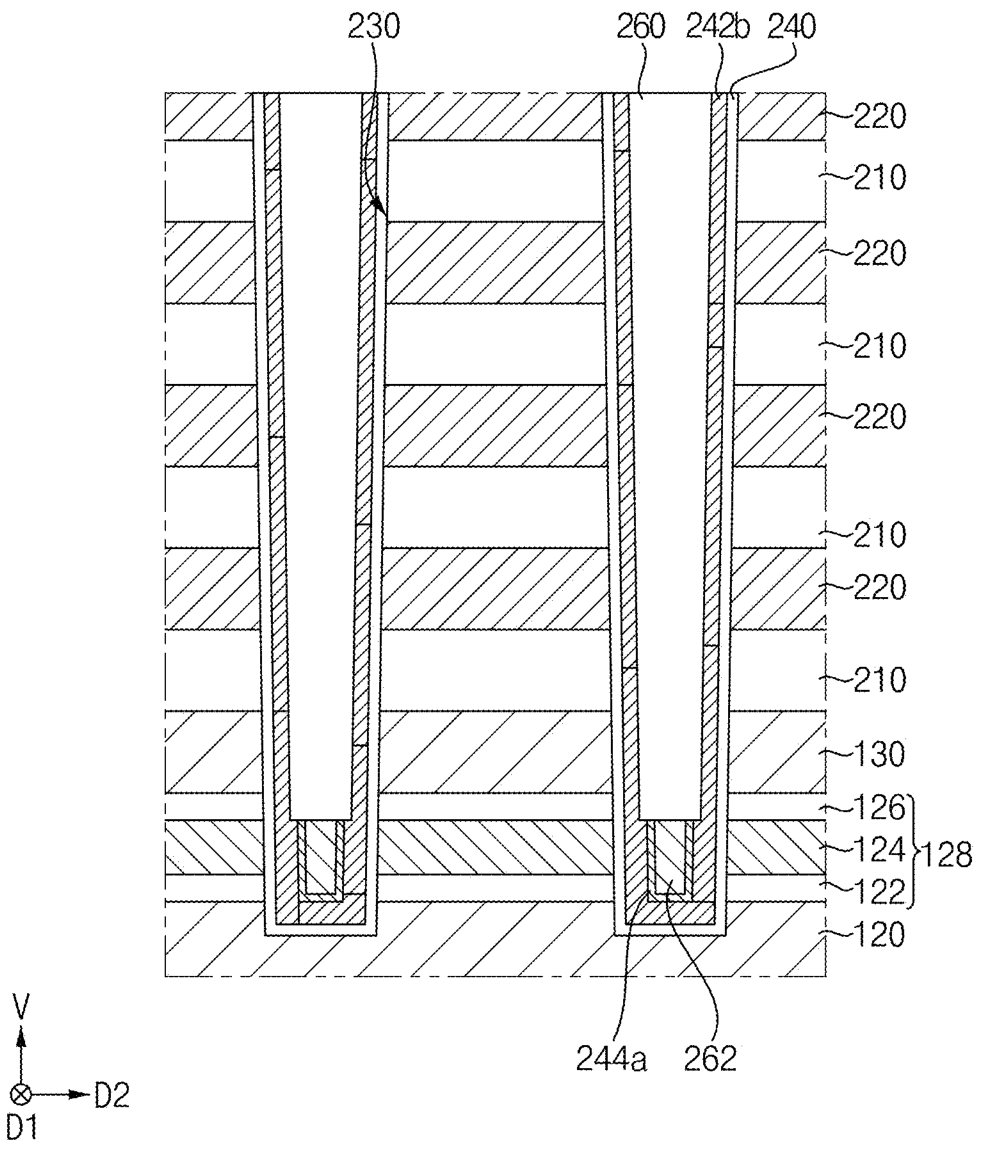

Referring to FIG. 13, a filling insulation layer 260 may be formed on the channel layer 242*b* to completely fill the channel hole 230. The filling insulation layer 260 may include oxide, e.g., silicon oxide. The filling insulation layer 260 may be formed by an atomic layer deposition process.

In the process for forming the filling insulation layer 260, at least an upper surface of the germanium pattern 250*a* may be oxidized to form a lower pattern 262. That is, the germanium pattern 250*a* may be entirely oxidized or a portion of the surface thereof may be oxidized depending on the process conditions for forming the filling insulation layer 260. Therefore, the lower pattern 262 may be formed at the lower portion of the channel hole 230, and the lower pattern 262 may include an oxide including silicon and germanium.

For example, most of the germanium pattern 250*a* may be oxidized so that the lower pattern 262 may be formed of an oxide including silicon and germanium. For another example, an upper portion of the germanium pattern 250*a* may be oxidized, so that the lower pattern 262 may have a structure in which a germanium pattern and an oxide including silicon and germanium are stacked.

Figure 14:
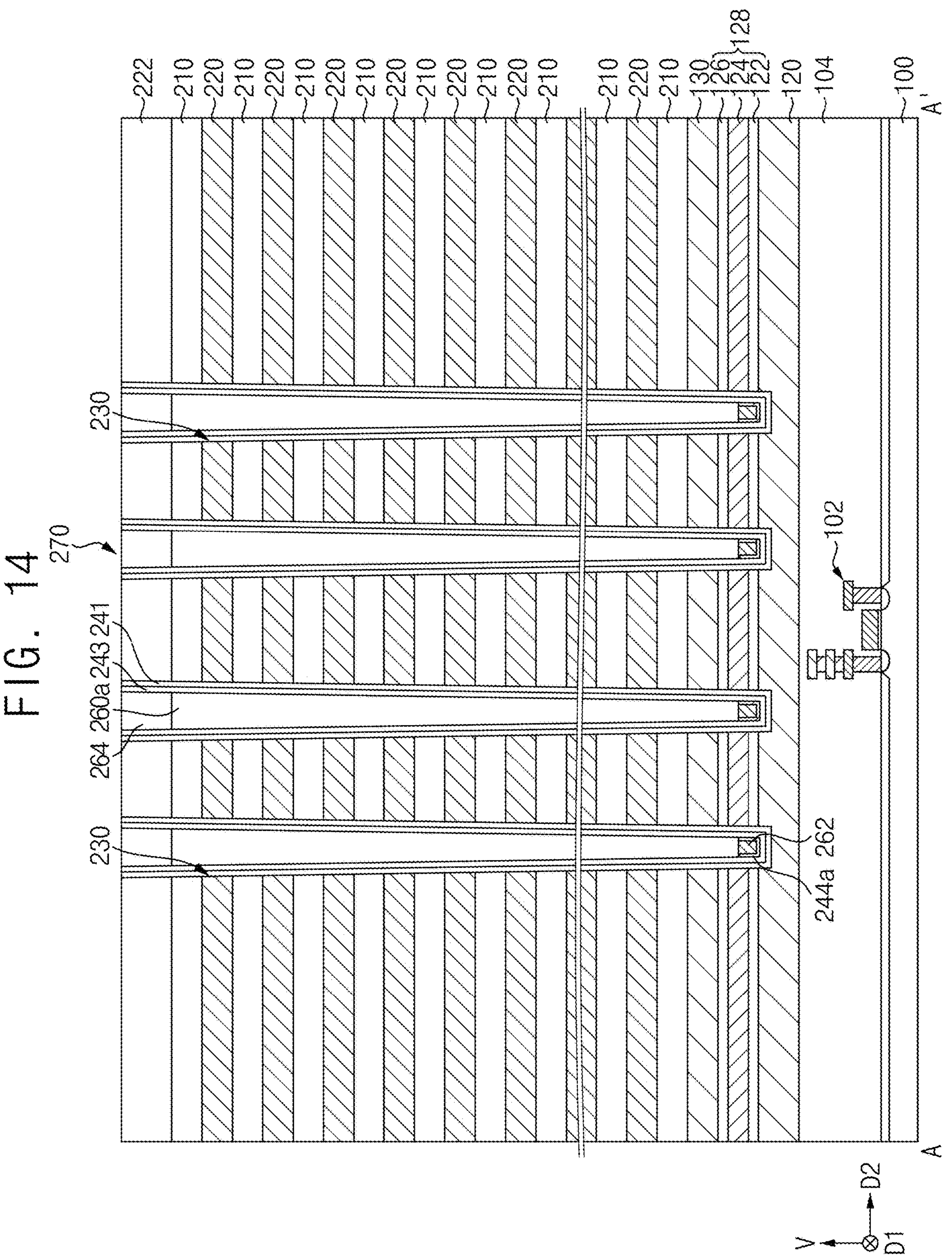

Referring to FIG. 14, the filling insulation layer 260, the channel layer 242*b* and the data storage layer 240 may be planarized until an upper surface of the upper insulation layer 222 may be exposed. Upper portions of the filling insulation layer 260 and the channel layer 242*b* and a capping pattern 264 may be removed to form a first recess. A capping pattern 264 may be formed in the first recess. The capping pattern 264 may include, e.g., polysilicon doped with impurities or undoped with impurities.

A channel structure 270 including a data storage structure 241, a channel 243, the first filling insulation pattern 260*a*, the lower pattern 262, the first mask pattern 244*a* and the capping pattern 264 may be formed in the channel hole 230.

The data storage structure 241 may include a first blocking dielectric layer pattern, a data storage pattern, and a tunnel insulation pattern sequentially stacked.

Figure 15:
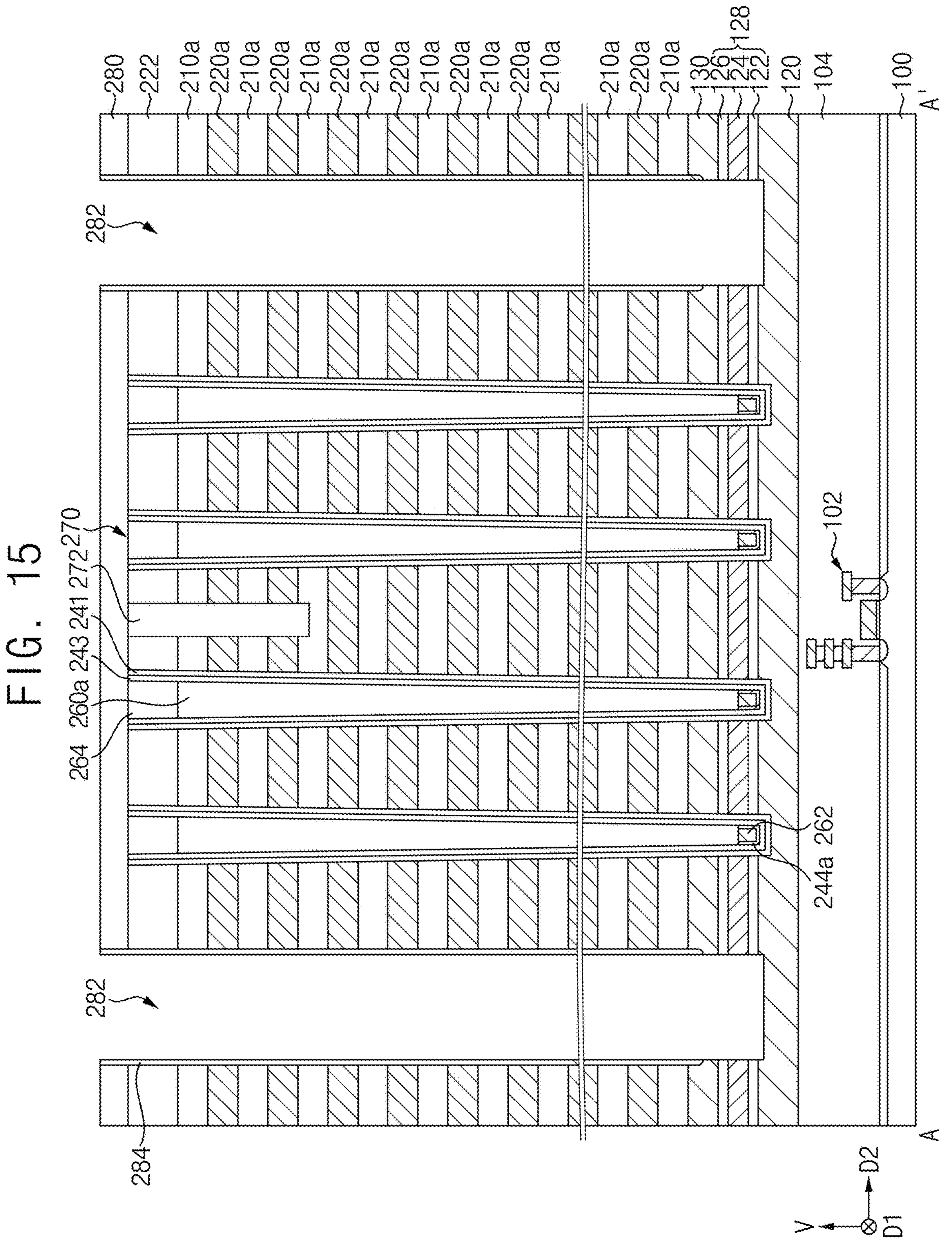

Referring to FIG. 15, portions of the upper insulation layer 222, the first insulation layers 210 and the first sacrificial layers 220 may be etched to form an upper trench extending in the first direction D1. An insulation material may fill the upper trench to form a separation pattern 272. The separation pattern 272 may serve as a cutting portion of the string selection line.

A first insulating interlayer 280 may be formed on the upper insulation layer 222, the separation pattern 272 and the channel structure 270.

The first insulating interlayer 280, the upper insulation layer 222, the first insulation layers 210 and the first sacrificial layers 220 may be etched to form a preliminary trench exposing the first support layer 130. In the etching process, an upper portion of the first support layer 130 may be partially etched. A first spacer 284 may be formed on the sidewall of the preliminary trench. In example embodiments, the first spacer 284 may include, e.g., undoped polysilicon.

Thereafter, exposed portions of the first support layer 130 and the first lower sacrificial layer structure 128 may be removed to form a trench 282 exposing an upper surface of the common source plate 120. In the removing process, the upper portion of the common source plate 120 may be partially etched.

The trench 282 may extend in the first direction. A plurality of trenches 282 may be arranged in the second direction.

The first insulation layers 210 and the first sacrificial layers 220 may be separated by the trench 282 to form first insulation patterns 210*a* and first sacrificial patterns 220*a*, respectively. A mold structure including the first insulation patterns 210*a* and first sacrificial patterns 220*a* may be formed on the common source plate 120, and the mold structure may extend in the first direction D1.

Figure 16:
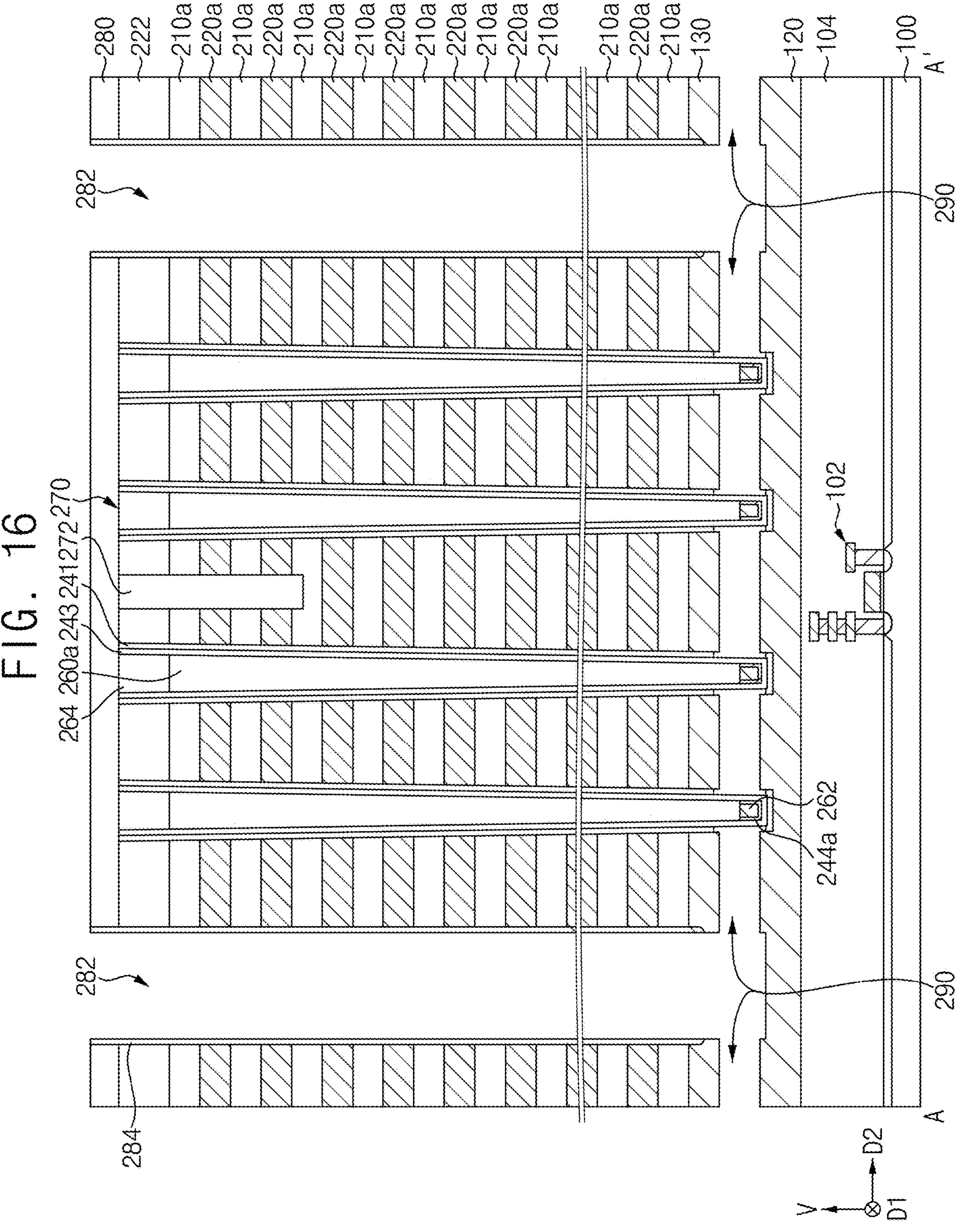

Referring to FIG. 16, the first lower sacrificial layer structure 128 exposed by the trench 282 may be removed to form a first gap 290.

A lower sidewall of the data storage structure 241 may be exposed by the first gap 290. The exposed lower sidewall of the data storage structure 241 may be removed together during the removing process, so that a portion of an outer wall of the channel 243 may be exposed. The data storage structure 241 may have an upper portion covering most of the outer wall of the channel 243, and a lower portion on the common source plate 120 that covers the lower portion and the lower surface of the channel 243.

Figure 17:
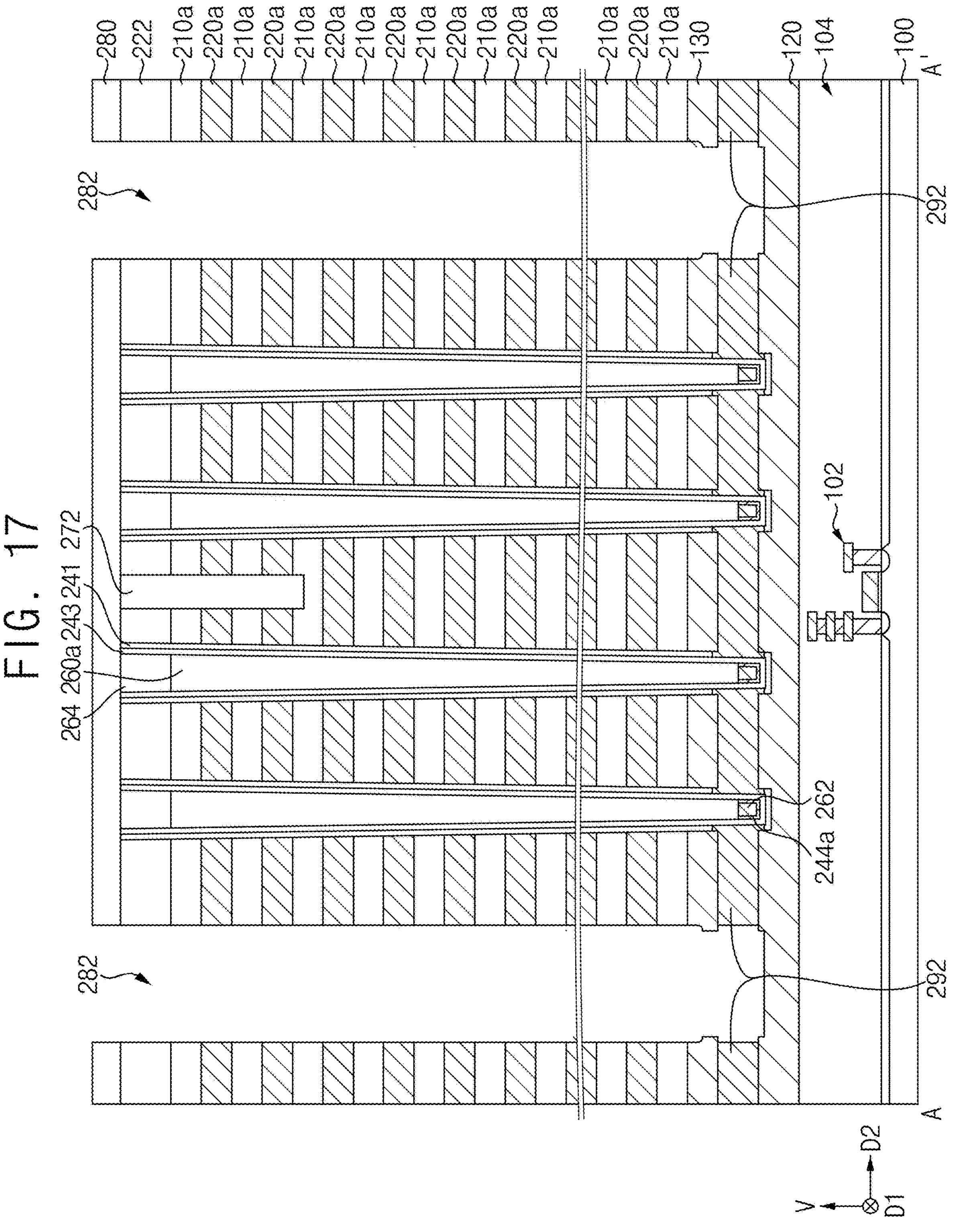

Referring to FIG. 17, the first spacer 284 may be removed, and a channel connection layer may be formed on a surface of the trench 282 and in the first gap 290. The channel connection layer may fill the first gap 290.

The channel connection layer formed on the surface of the trench 282 may be removed to form a channel connection pattern 292 in the first gap 290.

As the channel connection pattern 292 is formed, adjacent channels 243 may be electrically connected to each other. The channels 243 may be electrically connected to the common source plate 120 by the channel connection pattern 292. The channel connection pattern 292 may include, e.g., polysilicon doped with n-type impurities or undoped polysilicon.

Figure 18:
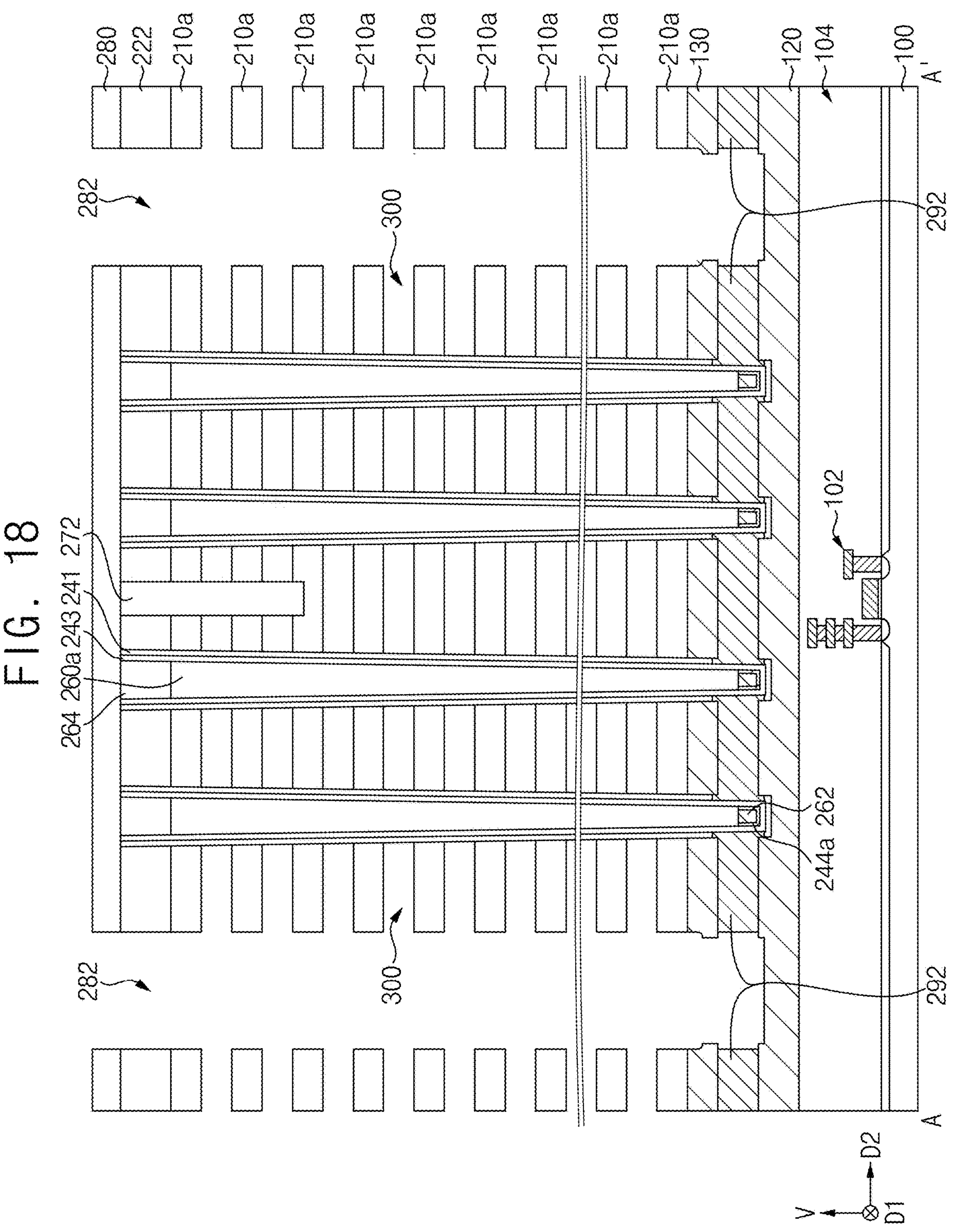

Referring to FIG. 18, the first sacrificial patterns 220*a* exposed by the trench 282 may be removed to form a second gap 300 between the first insulation patterns 210*a* of each layer. A portion of the outer wall of the channel structure 270 may be exposed by the second gap 300.

Figure 19:
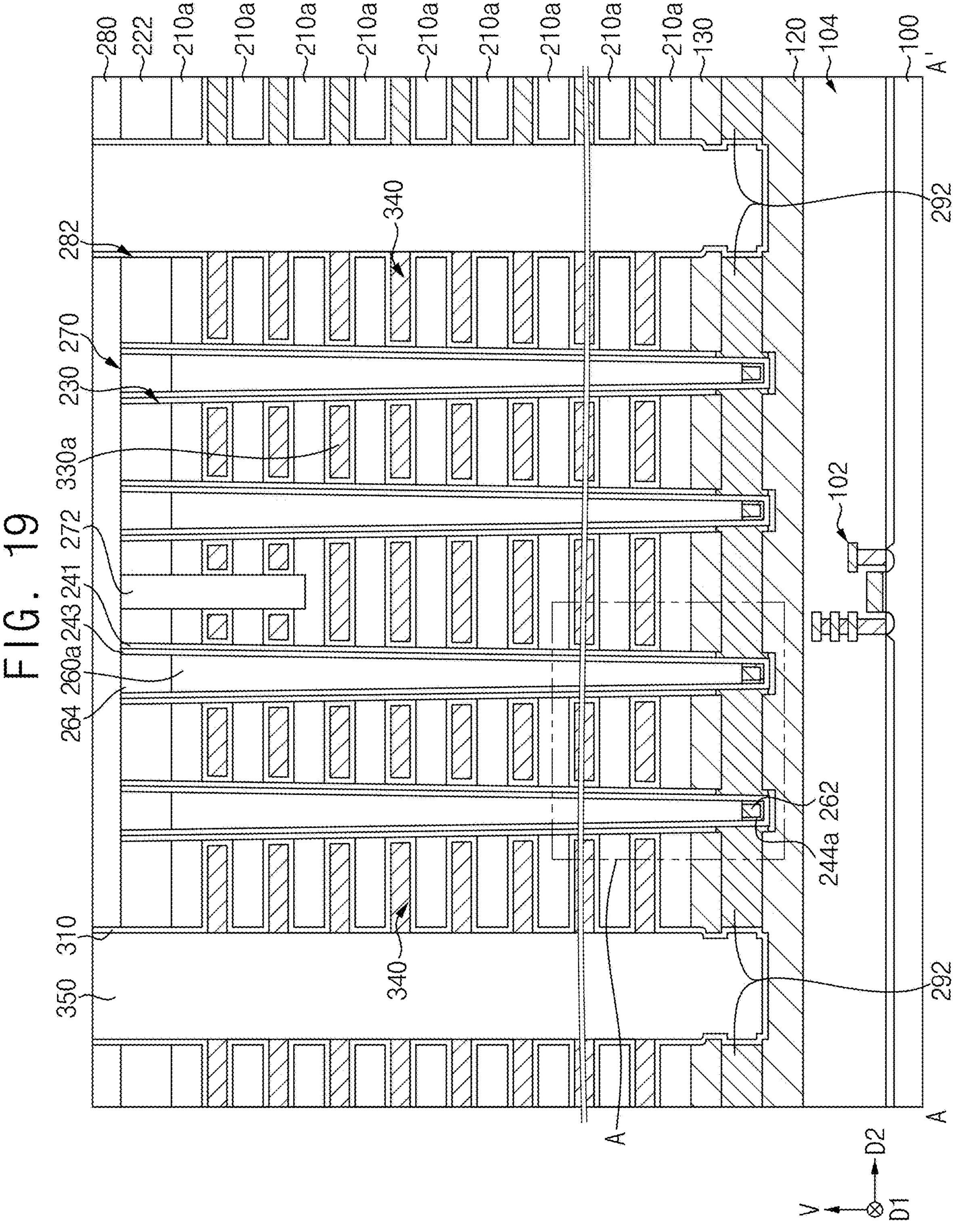

Referring to FIG. 19, a second blocking dielectric layer 310 may be conformally formed on the surface of the trench 282, and the surface of the first insulation patterns 210*a* and the outer wall of the channel structure 270 in the second gap 300. The second blocking dielectric layer 310 may include an oxide. For example, the second blocking dielectric layer 310 may include a metal oxide such as aluminum oxide, hafnium oxide, zirconium oxide, or the like.

A barrier metal layer (not shown) may be conformally formed on the second blocking dielectric layer 310. The barrier metal layer may include, e.g., titanium nitride, tantalum nitride, titanium, tantalum, tungsten nitride, tantalum silicon nitride, titanium, or titanium nitride.

A first metal layer may be formed on the barrier metal layer to fill the second gap 300. The first metal layer may include, e.g., tungsten, molybdenum, cobalt, or ruthenium.

Thereafter, the first metal layer and the barrier metal layer may be partially etched to form a first metal pattern 330 and a barrier metal pattern (not shown) in the second gap 300. The etching process may include an isotropic etching process.

By the etching process, the gate structure 340 including the second blocking dielectric layer 310, the barrier metal pattern and the first metal pattern 330 may be formed in the second gap 300. The first sacrificial patterns 220*a* included in the mold structure may be replaced with the gate structure 340. Accordingly, the mold structure may be converted into a pattern structure including the first insulation patterns 210*a* and the gate structures 340 alternately stacked.

An insulation layer may be formed on the first insulating interlayer 280 to fill the trench 282. The insulation layer may be planarized to form a second insulation pattern 350 filling the trench 282. The second insulation pattern 350 may include silicon oxide. In the planarization process, the second blocking dielectric layer 310 on the first insulating interlayer 280 may be removed.

Thereafter, although not shown, a second insulating interlayer may be formed on the first insulating interlayer 280 and the second insulation pattern 350. A contact plug may be formed through the second insulating interlayer, and may contact the capping pattern 264. Further, a bit line may be formed on an upper surface of the contact plug.

As described above, the vertical semiconductor device may be manufactured.

The vertical semiconductor device may have following structural characteristics.

Figure 20:
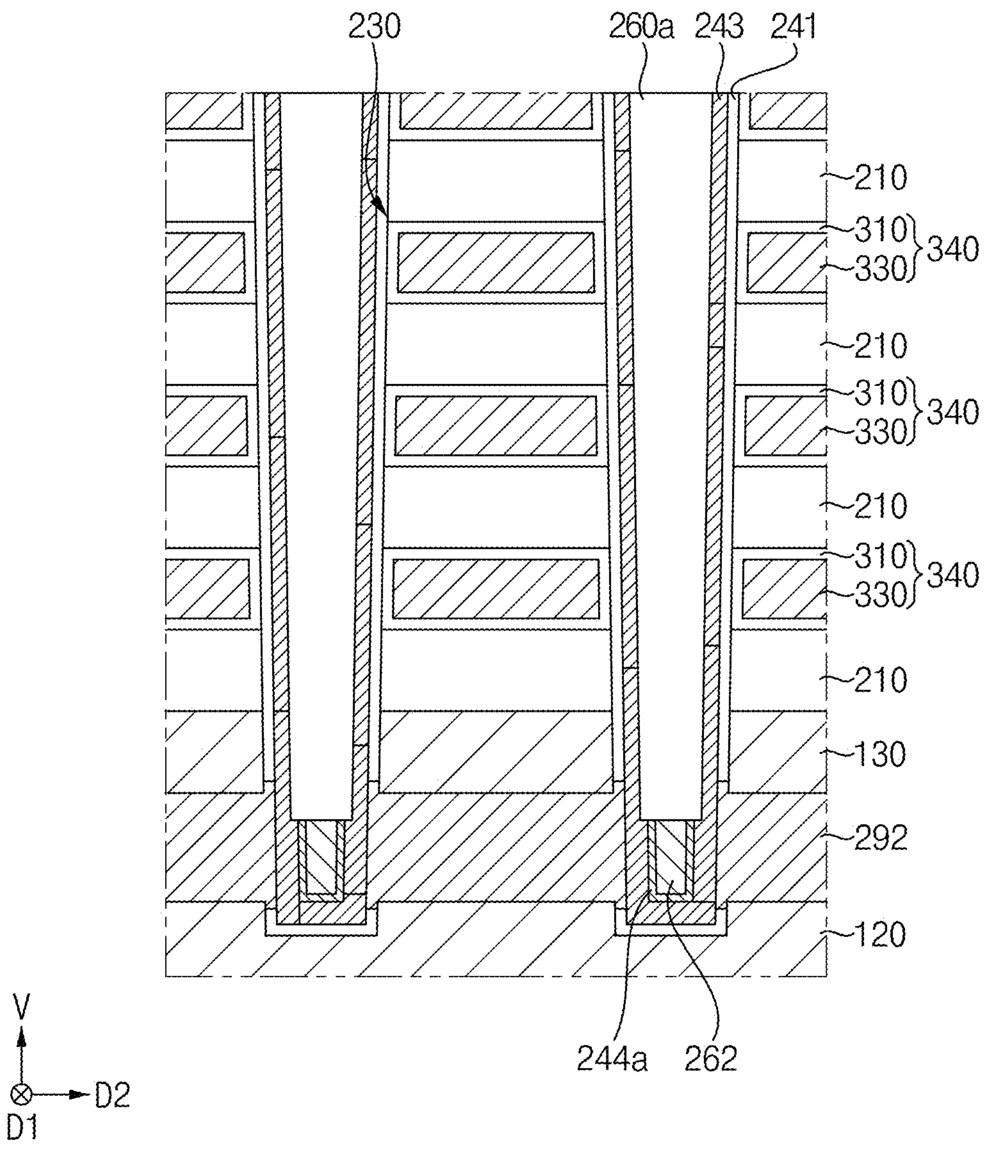
Figure 21:
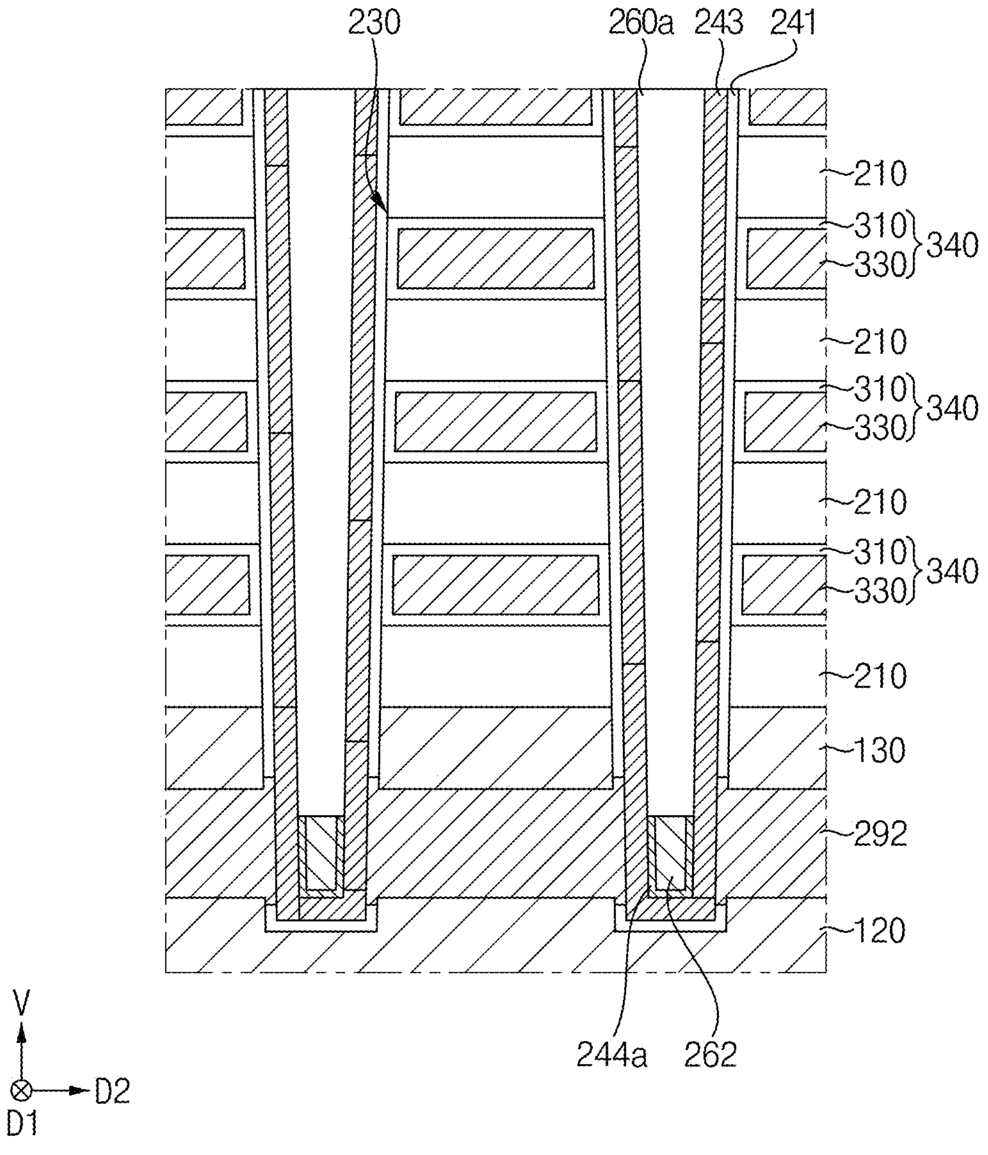

FIG. 20 is an enlarged cross-sectional view of a vertical semiconductor device in accordance with example embodiments. FIG. 21 is an enlarged cross-sectional view of a vertical semiconductor device in accordance with example embodiments.

FIG. 20 is an enlarged view of a portion A of FIG. 19.

Structural features of the vertical semiconductor device may be described with reference to FIGS. 19 and 20 together.

Referring to FIGS. 19 and 20, the vertical semiconductor device may include a lower circuit pattern 102 on a substrate 100, and a lower insulating interlayer 104 covering the lower circuit pattern 102. The lower circuit pattern 102 may constitute peripheral circuits in the vertical semiconductor device. A common source plate 120 may be on the lower insulating interlayer 104. The common source plate 120 may serve as an upper substrate.

Pattern structures in which gate structures 340 and first insulation patterns 210*a* are repeatedly and alternately stacked in the vertical direction may be formed on the common source plate 120. An upper insulation layer 222 may be formed on an uppermost portion of the pattern structure.

The pattern structure may extend in the first direction D1. A plurality of pattern structures may be arranged in the second direction D2. A trench 282 extending in the first direction D1 may be formed between the pattern structures. The trenches 282 may be formed at both sides of the pattern structure, respectively. An upper portion of the common source plate 120 may be exposed on a bottom of the trench 282.

A channel hole 230 may pass through the pattern structure, and the channel hole 230 may extend in the vertical direction. The channel hole 230 may extend to the upper portion of the common source plate 120. The upper portion of the common source plate 120 may be exposed on a bottom of the channel hole 230.

A channel structure 270 may be formed in the channel hole 230. The channel structure 270 may pass through the pattern structure, and may extend in the vertical direction. The channel structure 270 may extend to the upper portion of the common source plate 120.

The channel structure 270 may include a data storage structure 241, a channel 243, a first filling insulation pattern 260*a*, a lower pattern 262, a first mask pattern 244*a* and a capping pattern 264.

The data storage structure 241 may be formed along an inner surface of the channel hole 230. The data storage structure 241 may have a cutting portion at a lower sidewall of the channel hole 230. The data storage structure 241 may include an upper portion positioned on the sidewall of the channel hole 230 above the cutting portion, and a lower portion positioned on the lower sidewall and bottom of the channel hole 230 below the cutting portion. The data storage structure 241 may include a first blocking dielectric layer pattern, a data storage pattern, and a tunnel insulation pattern sequentially stacked from the sidewall of the channel hole 230.

The channel 243 may contact a surface of the data storage structure 241, and may have a cylindrical shape.

The channel 243 may be formed by a low-temperature crystallization of the amorphous silicon layer at a temperature of 600° C. or less using crystal nucleation formed from germanium. Accordingly, the channel 243 may include polysilicon containing a germanium element.

The channel 243 may have a great grain size and a reduced grain boundary. Therefore, mobility of cell transistors and selection transistor formed on the channel 243 may be improved. In example embodiments, the channel 243 may have the grain size greater than about 20 nm. For example, the channel 243 may have the grain size greater than about 50 nm.

The lower pattern 262 may be formed on the channel 243. The lower pattern 262 may fill a lower portion of the channel hole 230. The lower pattern 262 may include at least an oxide including silicon and germanium. For example, the lower pattern 262 may be formed of an oxide including silicon and germanium. For another example, the lower pattern 262 may have a structure in which a germanium pattern and an oxide including silicon and germanium are stacked.

The first mask pattern 244*a* may be formed along a bottom and a sidewall of the lower pattern 262. The first mask pattern 244*a* may be interposed between the lower pattern 262 and the channel 243. The first mask pattern 244*a* may include silicon nitride, silicon oxide, titanium nitride, aluminum oxide, or the like. In example embodiments, the first mask pattern 244*a* may include pin holes.

In example embodiments, as shown in FIG. 20, the channel 243 may have a first portion positioned higher than an upper surface of the lower pattern 262 and a second portion positioned lower than the upper surface of the lower pattern 262. A thickness of the first portion of the channel 243 may be less than a thickness of the second portion of the channel 243.

In some example embodiments, as shown in FIG. 21, the channel 243 may have a uniform thickness depending on positions thereof.

The first filling insulation pattern 260*a* may be formed on the channel 243 and the lower pattern 262, and may fill a remaining inner space of the channel hole 230. The first filling insulation pattern 260*a* may include silicon oxide.

The capping pattern 264 may be formed at an upper portion of the channel hole 230. The capping pattern 264 may be formed on the data storage structure 241, the channel 243 and the first filling insulation pattern 260*a*.

A channel connection pattern 292 and a first support layer 130 may be formed between the common source plate 120 and the pattern structure in the vertical direction.

The channel connection pattern 292 may directly contact an upper surface of the common source plate 120. Also, the channel connection pattern 292 may directly contact lower outer walls of the channels 243 in the channel structures 270. Accordingly, the channel connection pattern 292 may electrically connect the channels 243 to each other. Also, the channels 243 may be electrically connected to the common source plate 120 by the channel connection pattern 292. The first support layer 130 may be formed on the channel connection pattern 292. The pattern structure may be disposed on the first support layer 130.

In the pattern structure, the first insulation patterns 210*a* may be spaced apart from each other in the vertical direction V. The first insulation patterns 210*a* may extend in the first direction. In example embodiments, the first insulation patterns 210*a* may include silicon oxide.

The gate structure 340 may fill the second gap between adjacent first insulation patterns 210*a* in the vertical direction V. The gate structure 340 may contact sidewalls of the channel structures 270. The gate structure 340 may extend in the first direction.

In example embodiments, a lowermost gate structure 340 may serve as a ground select line (GSL), and one or two uppermost gate structures 340 may be serve as a string select line (SSL). Also, the gate structures 340 between the ground selection line and the string selection line may serve as a word line. A separation pattern 272 including an insulating material may be further formed between the string selection lines SSL in the second direction.

The gate structure 340 may include a second blocking dielectric layer 310, a barrier metal pattern and a first metal pattern 330.

The second blocking dielectric layer may be conformally formed on a surface of the trench 282, and a surface of the first insulation patterns 210*a* and the outer wall of the channel structure 270 in the second gap 300. The second blocking dielectric layer 310 may include an oxide. For example, the second blocking dielectric layer 310 may include a metal oxide such as aluminum oxide, hafnium oxide, zirconium oxide, or the like.

The barrier metal pattern (not shown) may be formed on the second blocking dielectric layer in the second gap. The barrier metal pattern may include, e.g., titanium nitride, tantalum nitride, titanium, tantalum, tungsten nitride, tantalum silicon nitride, titanium, or titanium nitride.

The first metal pattern 330 may be formed on the barrier metal pattern, and may fill the second gap. The first metal pattern 330 may include, e.g., tungsten, molybdenum, cobalt, or ruthenium.

A second insulation pattern 350 may fill the trench 282. The second insulation pattern 350 may include silicon oxide.

Although not shown, a second insulating interlayer may be formed on the first insulating interlayer 280 and the second insulation pattern 350. A contact plug may pass through the second insulating interlayer, and may contact the capping pattern 264. In addition, a bit line may contact an upper surface of the contact plug.

In the vertical semiconductor device having various structures, the channel may have a great grain size and a reduced grain boundary, as described above. Hereinafter, a vertical semiconductor device having a structure different from that described above may be described.

FIGS. 22 to 27 are cross-sectional views illustrating a method of manufacturing a vertical semiconductor device in accordance with example embodiments.

Figure 22:
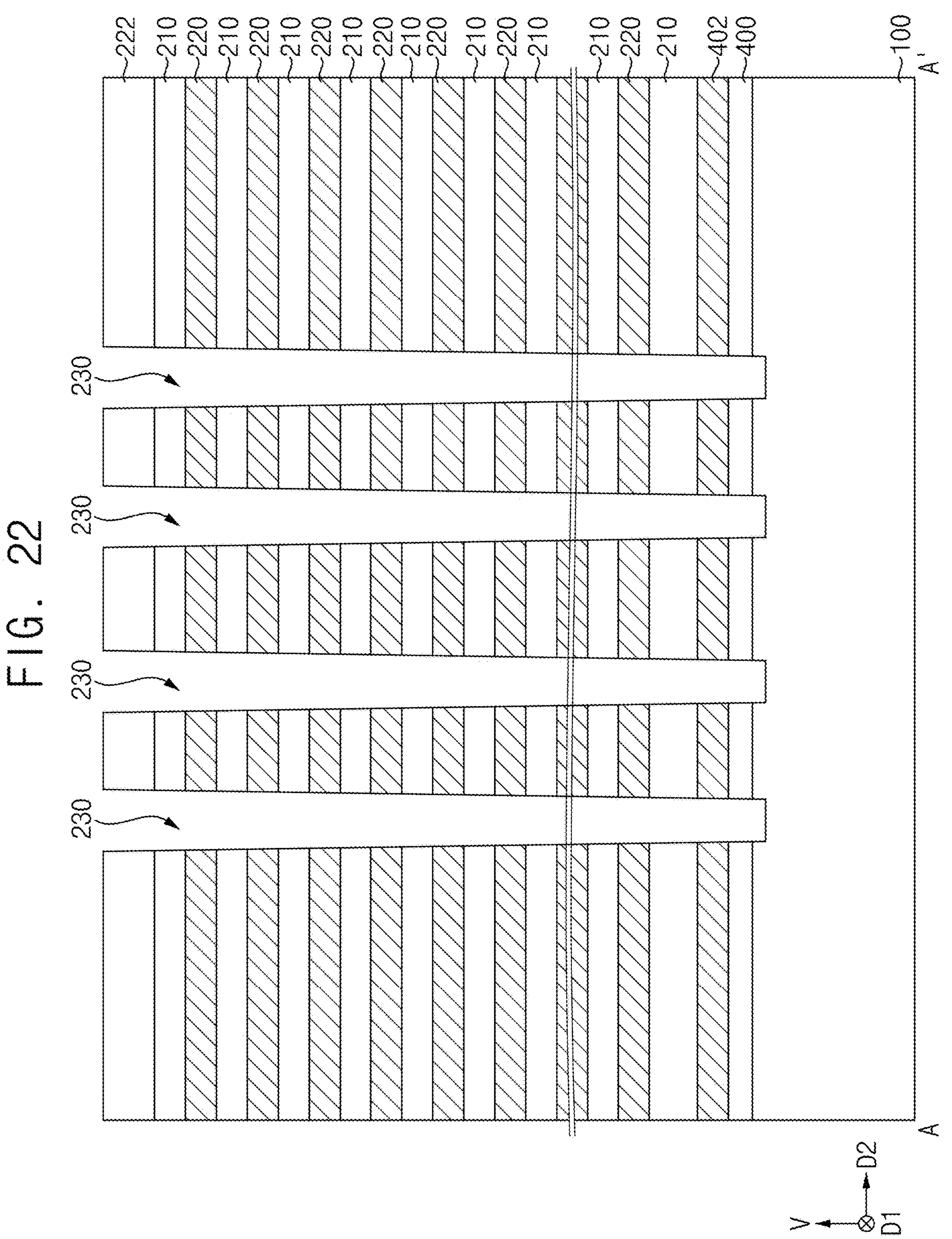

Referring to FIG. 22, the lower insulation layer 400 and the lower sacrificial layer 402 may be formed on the substrate 100. The first insulation layer 210 and the first sacrificial layer 220 may be alternately and repeatedly formed on the lower sacrificial layer 402 to form the mold layer. The upper insulation layer 222 may be formed on an uppermost first insulation layer 210.

The first insulation layer 210 may include, e.g., an oxide such as silicon oxide, and the first sacrificial layer 220 may include, e.g., a nitride such as silicon nitride.

Thereafter, an etch mask pattern (not shown) may be formed on the upper insulation layer 222. The upper insulation layer 222, the first insulation layers 210, the first sacrificial layers, the lower sacrificial layer 402, and the lower insulation layer 400 may be etched using the etch mask pattern to form the channel holes 230 exposing an upper portion of the substrate 100. A sidewall of the channel hole 230 may have an inclination such that an inner width gradually decreased to downward.

Figure 23:
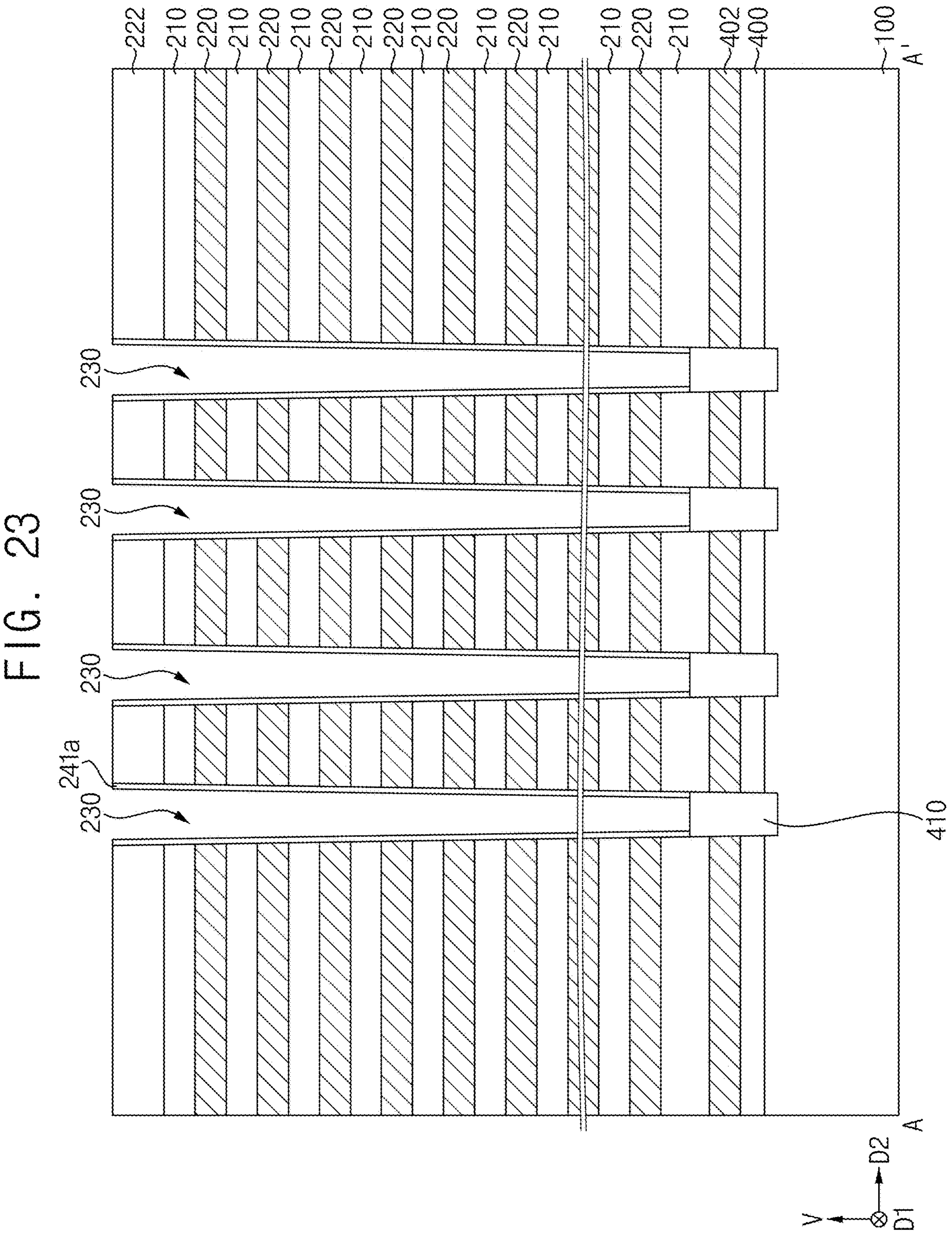

Referring to FIG. 23, a semiconductor pattern 410 may be formed on the substrate 100 exposed by a bottom of the channel hole 230. The semiconductor pattern 410 may be formed by a selective epitaxial growth process. The semiconductor pattern 410 may include single crystal silicon or single crystal silicon germanium.

The semiconductor pattern 410 may serve as a channel of the ground selection transistor. In example embodiments, the semiconductor pattern 410 may be formed at a lower portion of the channel hole 230. An upper surface of the semiconductor pattern 410 may be at least higher than an upper surface of the lower sacrificial layer 402. In example embodiments, the upper surface of the semiconductor pattern 410 may be lower than a lower surface of a lowermost first sacrificial layer 220.

The first blocking dielectric layer, the charge storage layer, and the tunnel insulation layer may be sequentially formed conformally on a sidewall of the channel hole 230, the upper surface of the semiconductor pattern 410, and the upper insulation layer 222. The first blocking dielectric layer, the charge storage layer, and the tunnel insulation layer may be anisotropically etched to form the first blocking dielectric layer pattern, the charge storage layer pattern, and the tunnel insulation layer pattern on the sidewall of the channel hole. The upper surface of the semiconductor pattern 410 may be exposed through the anisotropic etching process.

The first blocking dielectric layer pattern, the charge storage layer pattern, and the tunnel insulation layer pattern may be merged, and may be illustrated as a single pattern, which may be referred to as the data storage pattern 241*a*.

Figure 24:
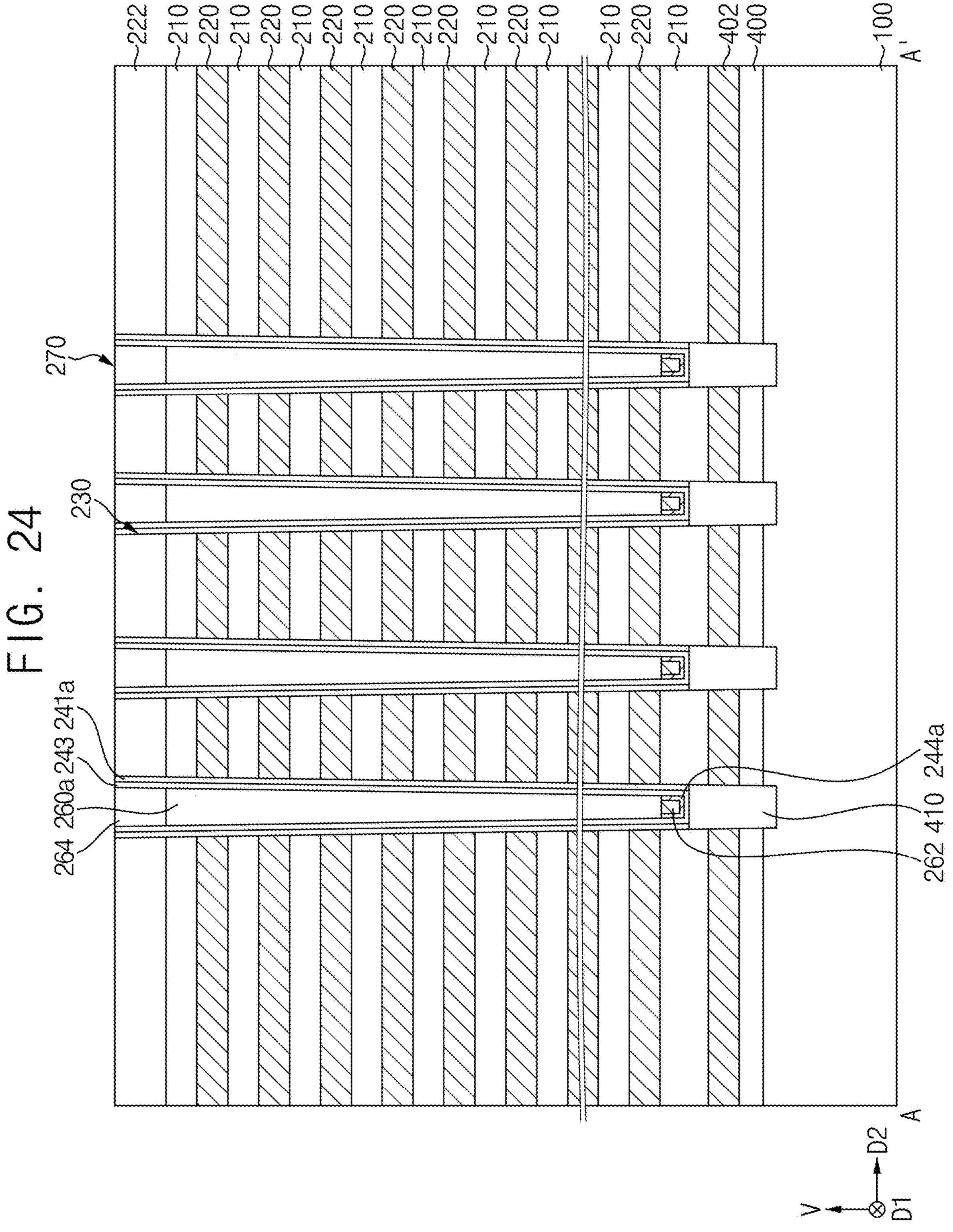

Referring to FIG. 24, the amorphous silicon layer may be conformally formed on the upper insulation layer 222, the data storage pattern 241*a*, and the semiconductor pattern 410. The amorphous silicon layer may contact the upper surface of the semiconductor pattern 410.

Thereafter, substantially the same process as described with reference to FIGS. 7 to 14 may be performed to form the channel structure 270 in the channel hole 230. The channel structure 270 may be formed on the semiconductor pattern 410, and may contact the upper surface of the semiconductor pattern 410.

The channel structure 270 may include the data storage pattern 241*a*, the channel 243, the first filling insulation pattern 260*a*, the lower pattern 262, the first mask pattern 244*a*, and the capping pattern 264.

Figure 25:
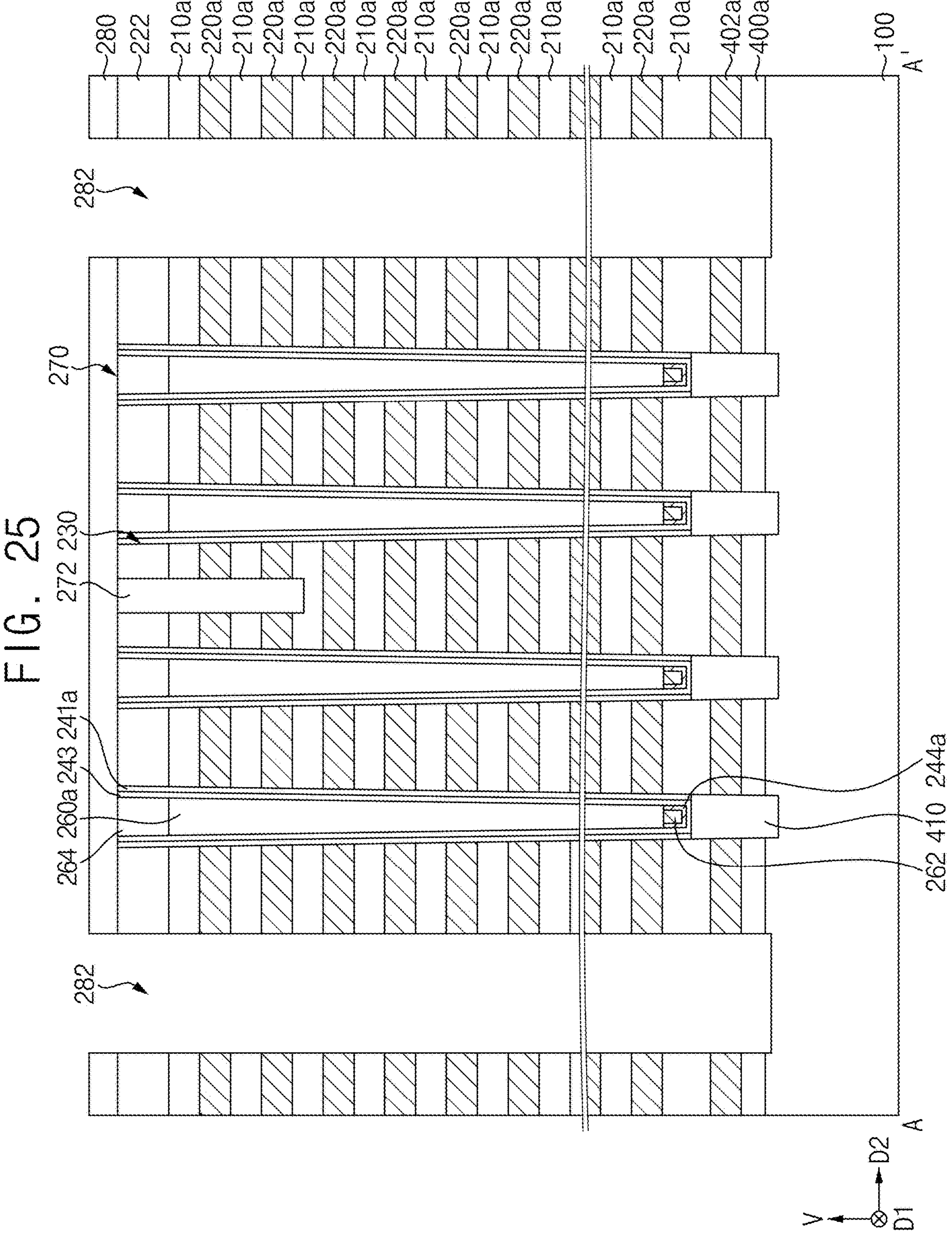

Referring to FIG. 25, the upper insulation layer 222, a portion of the first insulation layers 210 and a portion of the first sacrificial layers 220 may be etched to form the upper trench extending in the first direction. An insulating material may fill the upper trench to form the separation pattern 272.

The first insulating interlayer 280 may be formed on the upper insulation layer 222, the separation pattern 272 and the channel structure 270.

The first insulating interlayer 280, the upper insulation layer 222, the first insulation layers 210, the first sacrificial layers 220, the lower sacrificial layer 402 and the lower insulation layer 400 may be etched to form the trench 282 exposing the substrate 100.

As the trench 282 is formed, the first insulation layers 210 and the first sacrificial layers 220 may be separated to form first insulation patterns 210*a*, first sacrificial patterns 220*a*, lower insulation pattern 400*a* and a lower sacrificial pattern 402*a*, respectively.

Figure 26:
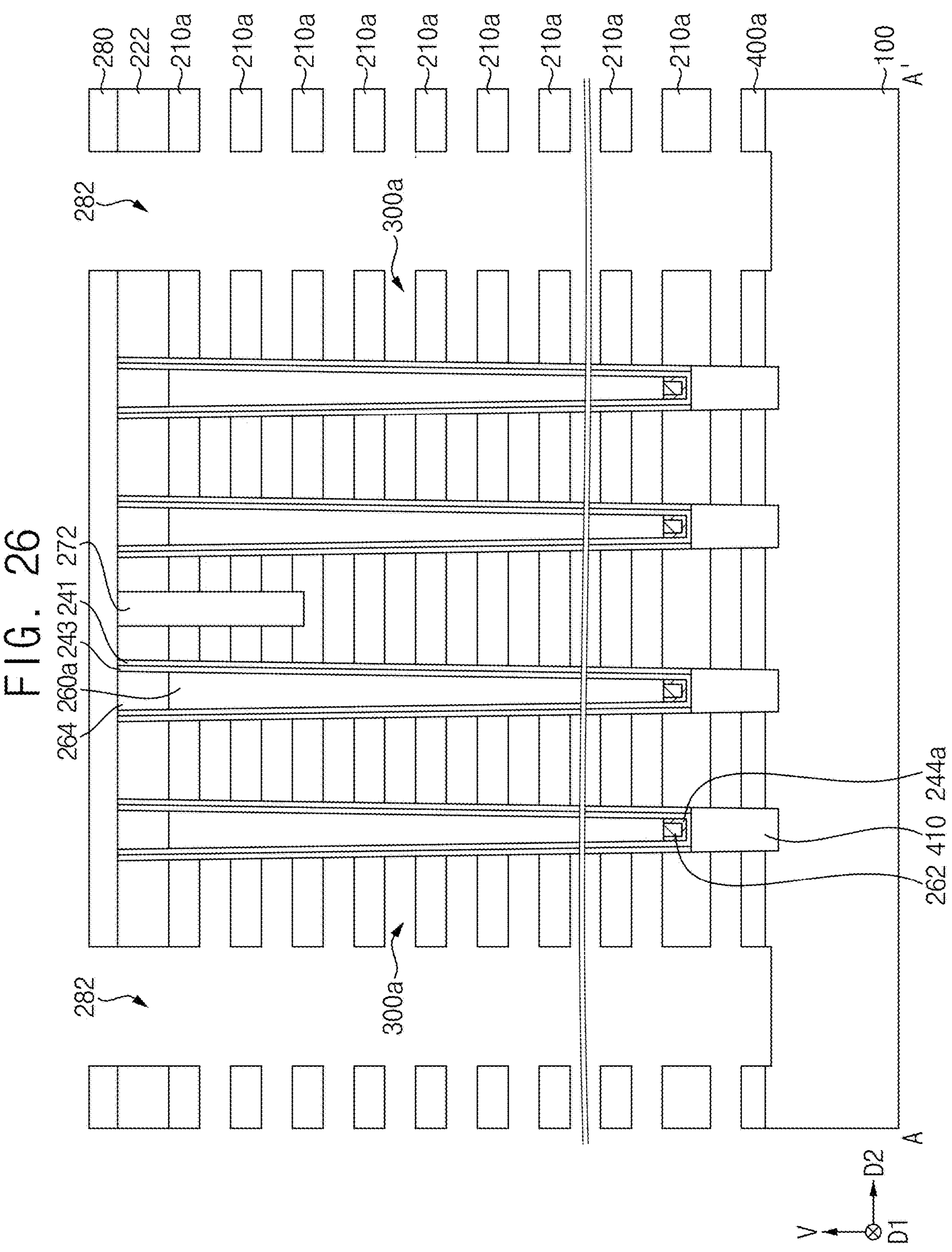

Referring to FIG. 26, the first sacrificial patterns 220*a* and the lower sacrificial pattern 402*a* exposed by the trench 282 may be removed to form the gap 300. Portions of the outer wall of the channel structure 270 and the outer wall of the semiconductor pattern 410 may be exposed by the gap 300*a*.

Figure 27:
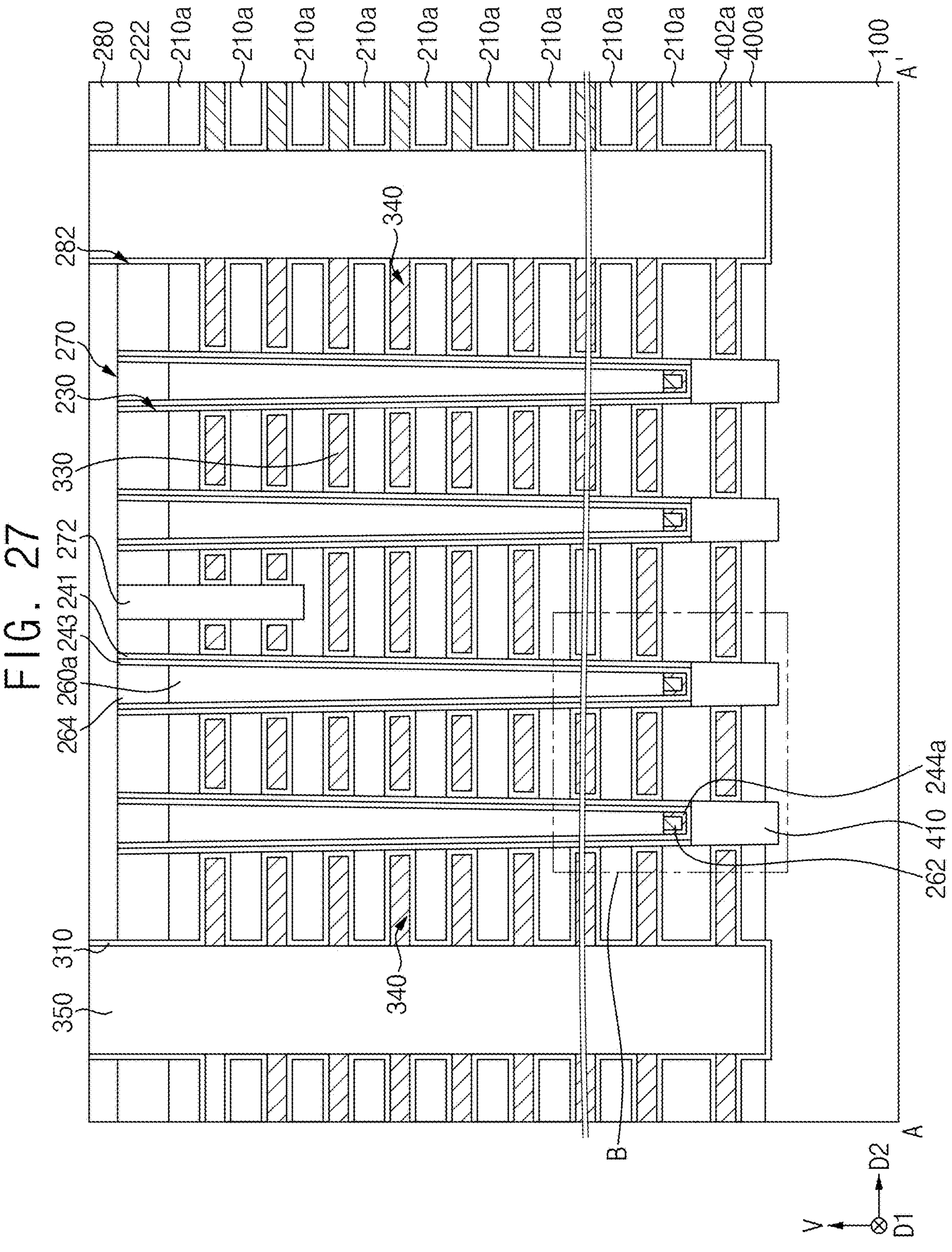

Referring to FIG. 27, the second blocking dielectric layer 310 may be conformally formed on a surface of the trench 282, and a surface of the first insulation patterns 210*a* and the outer wall of the channel structure 270 in the gap 300*a*. A barrier metal layer (not shown) may be conformally formed on the second blocking dielectric layer 310. The first metal layer may be formed on the barrier metal layer to fill the gap 300*a*. The first metal layer may include, e.g., tungsten, molybdenum, cobalt, or ruthenium.

Thereafter, the first metal layer and the barrier metal layer may be partially etched to form the first metal pattern 330 and a barrier metal pattern (not shown) in the gap 300*a*.

The gate structure 340 including the second blocking dielectric layer 310, the barrier metal pattern and the first metal pattern 330 may be formed in the gap 300*a*, by the etching process.

The insulation layer may be formed on the first insulating interlayer 280 to fill the trench 282. The insulation layer may be planarized to form a second insulation pattern 350 filling the trench 282.

Thereafter, although not shown, a second insulating interlayer may be formed on the first insulating interlayer 280 and the second insulation pattern 350. A contact plug may be formed pass through the second insulating interlayer, and may contact the capping pattern 264. In addition, a bit line may be formed on the upper surface of the contact plug.

The vertical semiconductor device manufactured by the above-described processes may have following structural characteristics.

Figure 28:
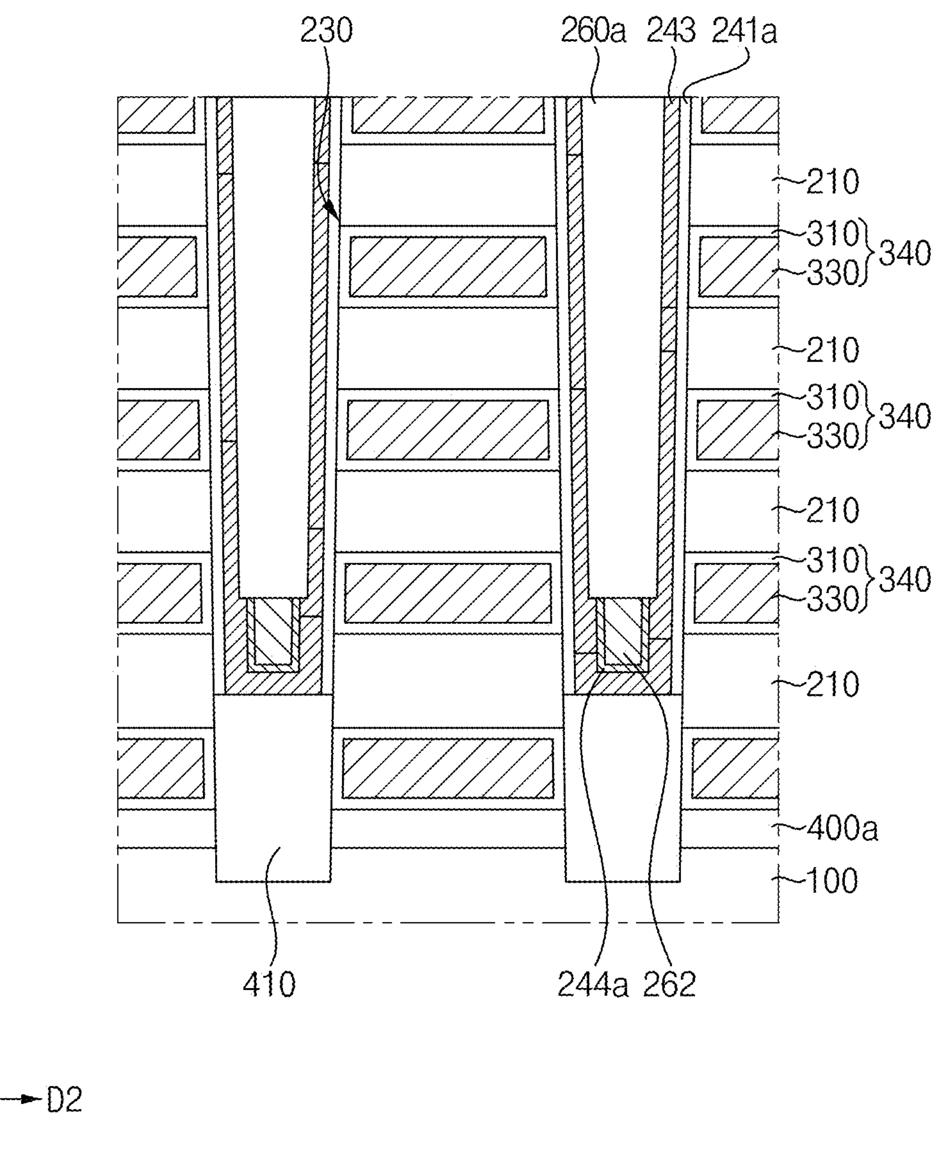

FIG. 28 is an enlarged cross-sectional view of a vertical semiconductor device in accordance with example embodiments.

FIG. 28 is an enlarged view of a portion B of FIG. 27.

Structural characteristics of the vertical semiconductor device are described with reference to FIGS. 27 and 28.

Referring to FIGS. 27 and 28, the pattern structures in which the gate structures 340 and the first insulation patterns 210*a* are repeatedly and alternately stacked in the vertical direction may be formed on the substrate 100. The upper insulation layer 222 may be formed on an uppermost portion of the pattern structure. The lower insulation layer may be formed on the substrate 100.

The pattern structure may extend in the first direction D1. A plurality of pattern structures may be arranged in the second direction D2. The trench 282 extending in the first direction D1 may be positioned between the pattern structures. The trenches 282 may be formed at both sides of the pattern structure, respectively. An upper portion of the substrate 100 may be exposed on a bottom of the trench 282.

The gate structure may include the second blocking dielectric layer 310, a barrier metal pattern, and the first metal pattern 330. In example embodiments, a lowermost gate structure 340 may serve as a ground select line (GSL), and one or two uppermost gate structures 340 may serve as a string select line (SSL). Also, the gate structure 340 between the ground selection line and the string selection line may serve as a word line.

The channel hole 230 may pass through the pattern structure, and may extend in the vertical direction. The channel hole 230 may extend to an upper portion of the substrate 100. The upper portion of the substrate 100 may be exposed by a bottom of the channel hole 230.

A semiconductor pattern 410 may be formed on the substrate 100 exposed by the bottom of the channel hole 230. The semiconductor pattern 410 may include single crystal silicon or single crystal silicon germanium.

The semiconductor pattern 410 may serve as the channel of the ground selection transistor. In example embodiments, an upper surface of the semiconductor pattern 410 may be higher than an upper surface of a lowermost gate structure 340. In example embodiments, the upper surface of the semiconductor pattern 410 may be lower than the gate structure 340 serving as a lowermost word line.

A channel structure 270 may be formed on the semiconductor pattern 410 to fill the channel hole 230. The channel structure 270 may include the data storage pattern 241*a*, the channel 243, the first filling insulation pattern 260*a*, the lower pattern 262, the first mask pattern 244*a*, and the capping pattern 264.

The data storage pattern 241*a* may be formed on a sidewall of the channel hole 230. The data storage pattern 241*a* may include the first blocking dielectric layer pattern, the charge storage layer pattern, and the tunnel insulation layer pattern stacked.

The channel 243 may contact the surface of the data storage pattern 241*a* and the upper surface of the semiconductor pattern 410. The channel 243 may have a cylindrical shape.

The channel 243 may be formed by low-temperature crystallization of the amorphous silicon layer at a temperature of 600° C. or less using a germanium as crystal nucleation. Accordingly, the channel 243 may be polysilicon including the germanium.

The channel 243 may have a great grain size and a reduced grain boundary. In example embodiments, the channel 243 may have a grain size greater than about 20 nm. For example, the channel 243 may have a grain size greater than about 50 nm.

The lower pattern 262 may be formed on the channel 243, and may fill a lower portion of the channel hole 243. The lower pattern 262 may include at least an oxide including silicon and germanium. The first mask pattern 244*a* may be formed along a bottom and a sidewall of the lower pattern 262.

The first filling insulation pattern 260*a* may be formed on the channel 243, and may fill a remaining space of the channel hole 230.

The capping pattern 264 may be formed at an upper portion of the channel hole 230. The capping pattern may be formed on the data storage pattern 241*a*, the channel 243 and the first filling insulation pattern 260*a*.

In example embodiments, the gate structure 340 facing a sidewall of the lower pattern 262 may not serve as an actual word line of the cell transistor. The gate structure 340 facing the sidewall of the lower pattern 262 may serve as a dummy word line.

The second insulation pattern 350 may fill the trench 282. The second insulation pattern 350 may include silicon oxide.

Although not shown, a second insulating interlayer may be formed on the first insulating interlayer 280 and the second insulation pattern 350. A contact plug may pass through the second insulating interlayer. The contact plug may contact the capping pattern 264. In addition, a bit line may be formed on an upper surface of the contact plug.

The vertical semiconductor device in accordance with example embodiments may be used in various electronic products.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
- a substrate;
- a pattern structure on the substrate, the pattern structure including insulation patterns and gate structures alternately stacked in a vertical direction perpendicular to an upper surface of the substrate; and
- a channel structure in a channel hole passing through the pattern structure, and the channel structure extending in the vertical direction, wherein the channel structure includes
- a data storage structure on an inner surface of the channel hole,
- a channel contacting the data storage structure, and having a cylindrical shape,
- a lower pattern on a bottom surface of the channel positioned at a lower portion of the channel hole, the lower pattern including an oxide including silicon and germanium, and
- a filling insulation pattern on the channel and the lower pattern.

2. The semiconductor device of claim 1, wherein the channel includes polysilicon containing germanium.

3. The semiconductor device of claim 2, wherein the channel includes a first portion and a second portion, the first portion of the channel is positioned higher than an upper surface of the lower pattern, the second portion of the channel is positioned lower than the upper surface of the lower pattern, and a thickness of the first portion is less than a thickness of the second portion.

4. The semiconductor device of claim 2, wherein the channel has a uniform thickness depending on positions.

5. The semiconductor device of claim 1, wherein the channel structure further includes a first mask pattern between the channel and the lower pattern.

6. The semiconductor device of claim 5, wherein the first mask pattern includes silicon nitride, silicon oxide, titanium nitride, or aluminum oxide.

7. The semiconductor device of claim 5, wherein the first mask pattern includes pin holes.

8. The semiconductor device of claim 1, wherein the filling insulation pattern includes silicon oxide.

9. The semiconductor device of claim 1, wherein the channel has a grain size greater than 20 nm.

10. A semiconductor device, comprising:

a substrate;

a pattern structure on the substrate, the pattern structure including insulation patterns and gate structures alternately stacked in a vertical direction perpendicular to an upper surface of the substrate; and a channel structure in a channel hole passing through the pattern structure, and the channel structure extending in the vertical direction, wherein the channel structure includes a data storage structure on a sidewall of the channel hole, a channel contacting the data storage structure, the channel having a cylindrical shape, and the channel including polysilicon containing germanium, a lower pattern on the channel and positioned at a lower portion of the channel hole, a first mask pattern between the channel and the lower pattern, and a filling insulation pattern on the channel and the lower pattern, the filling insulation pattern including silicon oxide.

11. The semiconductor device of claim 10, wherein the lower pattern includes an oxide including silicon and germanium.

12. The semiconductor device of claim 10, wherein the channel includes a first portion and a second portion, the first portion of the channel is positioned higher than an upper surface of the lower pattern, the second portion of the channel is positioned lower than the upper surface of the lower pattern, and a thickness of the first portion is less than a thickness of the second portion.

13. The semiconductor device of claim 10, further comprising:

a common source plate on the substrate; and a channel connection pattern on the common source plate, the channel connection pattern contacting an upper surface of the common source plate and a lower outer wall of the channel.

14. The semiconductor device of claim 10, further comprising:

a semiconductor pattern in a lower portion of the channel hole, wherein the semiconductor pattern contacts the substrate, and the channel structure is on the semiconductor pattern.

15. The semiconductor device of claim 10, wherein the first mask pattern includes silicon nitride, silicon oxide, titanium nitride, or aluminum oxide.

* * * * *